(12) United States Patent
Vega et al.

(10) Patent No.: US 7,548,455 B2
(45) Date of Patent: Jun. 16, 2009

(54) MULTI-VALUED LOGIC/MEMORY CELLS AND METHODS THEREOF

(75) Inventors: Reinaldo Vega, Berkeley, CA (US); Stephen Sudirgo, Rio Rancho, NM (US)

(73) Assignee: Rochester Institute of Technology, Rochester, NY (US)

(*) Notice: Subject to any disclaimer, the term of this patent is extended or adjusted under 35 U.S.C. 154(b) by 0 days.

(21) Appl. No.: 11/745,328

(22) Filed: May 7, 2007

(65) Prior Publication Data

US 2008/0037316 A1 Feb. 14, 2008

Related U.S. Application Data

(60) Provisional application No. 60/797,889, filed on May 5, 2006.

(51) Int. Cl.
*G11C 11/36* (2006.01)

(52) U.S. Cl. .......................................... 365/175; 365/72

(58) Field of Classification Search ................. 365/175, 365/115
See application file for complete search history.

(56) References Cited

U.S. PATENT DOCUMENTS

| | | | |
|---|---|---|---|
| 3,996,484 A | 12/1976 | Abraham | |
| 4,360,897 A | 11/1982 | Lehovec | |
| 4,396,999 A | 8/1983 | Malaviya | |
| 5,267,193 A * | 11/1993 | Lin | ............................. 365/168 |
| 5,390,145 A | 2/1995 | Nakasha et al. | |
| 5,541,422 A | 7/1996 | Wolf et al. | |
| 5,672,536 A | 9/1997 | Wu et al. | |
| 5,770,497 A | 6/1998 | Wu et al. | |
| 5,780,906 A | 7/1998 | Wu et al. | |
| 5,825,687 A * | 10/1998 | Yin | ............................. 365/175 |
| 5,936,265 A | 8/1999 | Koga | |
| 5,976,926 A | 11/1999 | Wu et al. | |
| 6,104,631 A | 8/2000 | El-Sharawy et al. | |
| 6,140,685 A | 10/2000 | Wu et al. | |
| 6,184,539 B1 | 2/2001 | Wu et al. | |
| 6,301,147 B1 | 10/2001 | El-Sharawy et al. | |
| 6,303,941 B1 | 10/2001 | Xie et al. | |
| 6,310,798 B1 | 10/2001 | Morimoto | |
| 6,316,305 B1 | 11/2001 | Noble | |
| 6,342,718 B1 | 1/2002 | Noble | |

(Continued)

OTHER PUBLICATIONS

Inokawa et al., "A Multiple-valued Logic and Memory with Combined Single-Electron and Metal-oxide-semiconductor Transistors," In Electron Devices, IEEE Transactions at http://www.brl.ntt.co.jp/people/inokawa/files/inokawa2003TED.pdf> 50(2):462-470 (2003).

(Continued)

*Primary Examiner*—Tan T. Nguyen
(74) *Attorney, Agent, or Firm*—Nixon Peabody LLP

(57) ABSTRACT

A memory cell and method for making a memory cell in accordance with embodiments of the present invention includes two or more tunnel diodes, a loading system, and a driving system. The two or more tunnel diodes are coupled together, the loading system is coupled to the tunnel diodes and the driving system is coupled to the tunnel diodes and the loading system. The driving system drives a sense node from the tunnel diodes, the loading system, and the driving system between at least three or more substantially stable logic states.

20 Claims, 22 Drawing Sheets

U.S. PATENT DOCUMENTS

| | | | |
|---|---|---|---|
| 6,472,263 | B1 | 10/2002 | Noble |
| 6,675,822 | B1 | 1/2004 | Schmitz et al. |
| 6,781,459 | B1 | 8/2004 | Brown |
| 6,803,598 | B1 | 10/2004 | Berger et al. |
| 6,815,711 | B2 | 11/2004 | Geens et al. |
| 2004/0066689 | A1 | 4/2004 | Brocklin et al. |
| 2004/0246764 | A1 | 12/2004 | King |
| 2004/0262656 | A1 | 12/2004 | Uemura |

OTHER PUBLICATIONS

Cheng et al., "Possibility of Combined Use of Neuron-MOS and RTD in Mulit-Valued Logic Circuits," IEEE, pp. 1357-1360 (2003).

Waho et al., "A Novel Multiple-Valued Logic Gate Using Resonant Tunneling Devices," IEEE Electron Device Letters, 17(5):223-225 (1996).

Van Hoof et al., "Four Logic States Using Two Resonant Tunneling Diodes," Electronics Letters, 25(4):259-260 (1989).

Seabaugh et al., "Nine-State Resonant Tunneling Diode Memory," IEEE Electron Device Letters, 13(9):479-481.

Wei et al. "A Multi-State Memory Using Resonant Tunneling Diode Pair," IEEE, pp. 2924-2927, Jun. 1991.

Soderstrom et al., "A Multiple-State Memory Cell Based on the Resonant Tunneling Diode," IEEE Electron Device Letters, 9(5):200-202 (1988).

Van Der Wagt et al., "Multibit Resonant Tunneling Diode SRAM Cell Based on Slew-Rate Addressing," IEEE Transactions on Electron Devices, 46(1):55-62 (1999).

Wei et al., "Multiple Peak Resonant Tunneling Diode for Multi-Valued Memory," IEEE, pp. 190-195 (1991).

Mazumder, "Multiple-Valued Logic Circuits Using Resonant Tunneling Diodes," IEEE, pp. 123-126 (1997).

Uemura et al., "Proposal for Four-Valued MRAM based on MTJ/RTD Structure," Proceedings of the 33rd International Symposium on Multi-Valued Logic, pp. 1-6 (2003).

Van Der Wagt et al., "RTD/HFET Low Standby Power SRAM Gain Cell," IEEE, pp. 425-428 (1996).

Shieh et al., "Series Resonant Tunneling Diodes as a Two-Dimensional Memory Cell," IEEE, pp. 158-163 (1993).

Wei et al., "Unique Folding and Hysteresis Characteristics of RTD for Multi-valued Logic and Counting Applications," IEEE, pp. 27-33 (1992).

Kao et al., "Vertical Integration of Structured Resonant Tunneling Diodes on InP for Multi-Valued Memory Applications," Indium Phosphide and Related Materials, pp. 489-492 (1992).

Van Der Wagt, "Tunneling-Based SRAM," Proceedings of the IEEE, 87(4):571-595 (1999).

Chen et al., "Monolithic Integration of Resonant Tunneling Diodes and FET's for Monostable-Biostable Transition Logic Elements (MOBILE's)," IEEE Electron Device Letters, 16(2):70-73 (1995).

Huang et al., "An Improved Multipeak Resonant Tunnel Diode Model For Nine-State Resonant Tunneling Diode Memory Circuit Simulation," IEEE Transaction On Electron Devices, 42:1705-1707 (1995).

Capasso et al., Resonant Tunneling Devices With Multiple Negative Differential Resistance and Demostration Of Three-State Memory Cell For Multi-Valued Memory Applications, IEEE Electron Device Letters, 8(7):297-299 (1987).

Jin et al., "Tri-State Logic Using Vertically Integrated Si/SiGe Resonant Interband Tunneling Diodes With Double NDR," IEEE Electron Device Letters, 25(9):646-648 (2004).

Wei et al., "Multivalued SRAM Cell Using Resonant Tunneling Diodes," IEEE Journal of Solid State Circuit, 27 (2):212-216 (1992).

Lin et al., "Resonant Tunneling Diodes for Multi-Valued Digital Applications," Proceedings Of The 24th International Symposium on Multi-Valued Logic, pp. 188-195 (1994).

\* cited by examiner

MULTI-VALUED LOGIC/MEMORY CELLS AND METHODS THEREOF

This application claims the benefit of U.S. Provisional Patent Application Ser. No. 60/797,889, filed May 5, 2006, which is hereby incorporated by reference in its entirety.

This invention was made with Government support under Grant No. ECS-01460, awarded by National Science Foundation. The U.S. Government may have certain rights.

FIELD OF THE INVENTION

The present invention generally relates to memory circuits and, more particularly, to multi-valued logic/memory (MVM) cells and methods thereof.

BACKGROUND

In the case of a binary tunneling based static random access memory (TSRAM) cell, prior technology used one tunnel diode connected to a load transistor, where the connection point between the devices is the sense node (Vout). In this example, the load transistor is an enhancement mode NFET, although a depletion mode NFET could be used. The drain of the load NFET is placed at some positive bias (Vds) greater than the Vhigh (the "1" state that the TSRAM cell latches into). The gate of the load NFET is placed at some value (Vgs) such that the current-voltage (I-V) curve of the load NFET crosses the negative differential resistance (NDR) region of the tunnel diode. This is called the standby state.

By increasing Vgs such that the I-V curve of the load NFET is higher than the peak current of the tunnel diode, this I-V curve now intersects the tunnel diode I-V curve at one point (rather than three, two of which are stable, in the standby state). Decreasing Vgs back to the standby value results in the TSRAM cell latching into the Vhigh state. Likewise, switching Vgs to a value such that the load NFET I-V curve drops below the valley current of the tunnel diode, and then back to the standby value, latches the TSRAM cell in to the Vlow (logic low, or "0") state. This approach is called the dynamic load approach, because Vgs of the load NFET is varied, and from an architectural standpoint, the static load approach is supposedly better. The load NFET also can be replaced by a resistor or tunnel diode.

In the static load approach, the same circuit is used, except that a "driver" FET is placed at Vout, and this driver FET acts as a source or sink of current. In doing so, additional current is forced through the tunnel diodes in one direction or another, effectively shifting the tunnel diode I-V characteristic up or down to achieve the same result. In this case, however, Vgs of the load NFET is held constant (hence the term "static load").

SUMMARY

A memory cell in accordance with embodiments of the present invention includes two or more tunnel diodes, a loading system, and a driving system. The two or more tunnel diodes are coupled together, the loading system is coupled to the tunnel diodes and the driving system is coupled to the tunnel diodes and the loading system. The driving system drives a sense node from the tunnel diodes, the loading system, and the driving system between at least three or more substantially stable logic states.

A method for making a memory cell in accordance with other embodiments of the present invention includes coupling two or more tunnel diodes together, coupling a loading system to the tunnel diodes, and coupling a driving system to the loading system and the tunnel diodes. The driving system drives a sense node from the tunnel diodes, the loading system, and the driving system between at least three or more substantially stable logic states.

The present invention provides a number of advantages including providing a MVM tunneling SRAM (TSRAM) cell or tunneling DRAM (TDRAM) cell which exponentially increases the amount of information that can be stored per memory cell. By way of example only, in binary the number of combinations of logic levels that can be stored in an 8-bit "word" (or byte) is $2^8$ or 256 combinations. By adding four logic levels in accordance with embodiments of the present invention for these 8-bits, the number of possible combinations increases to $4^8$ or 65,536. Accordingly, with the present invention enormous amounts of data can be stored in very small spaces.

The present invention also provides a memory cell that allows for easier latching between logic states. Prior memory cells, when latching into any state between the lowest and highest state, experience an effect known as hysteresis, which reduces the operating voltage margins for each logic level and tightens the device performance constraints to achieve latching between logic levels. The latching method and mechanisms therefore become very complicated. While the present invention does not eliminate hysteresis, it effectively eliminates its effect to allow for latching to states between the lowest and highest logic states in a far less complicated manner. In doing so, memory cells with a high number of logic levels can be more practically realized with the present invention.

DETAILED DESCRIPTION

Memory cells 100(1)-100(7) in accordance with embodiments of the present invention are illustrated in FIGS. 1, 4, 7, 10, 14, 17 and 19. The present invention provides a number of advantages including providing a memory cell which exponentially increases the amount of information that can be stored per memory cell and which allows for easier latching between logic states.

Figure 1:
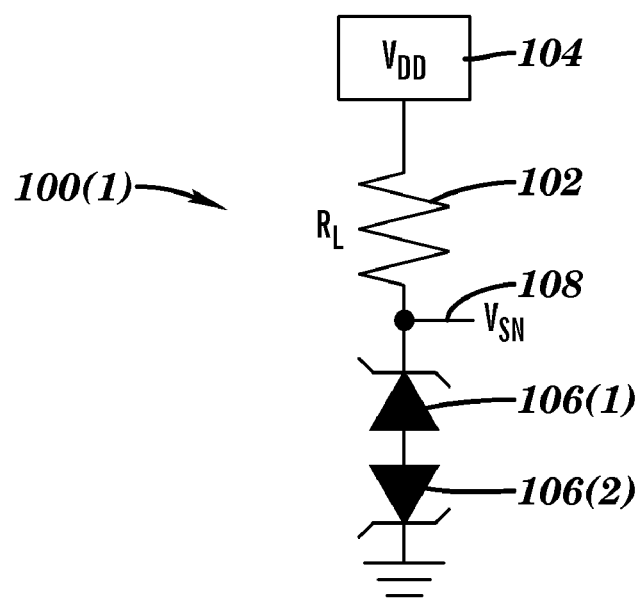
FIG. 1 is an ambipolar memory cell with a resistive load in accordance with embodiments of the present invention.

Referring more specifically to FIG. 1, an ambipolar memory cell 100(1) with a resistive load in accordance with embodiments of the present invention is illustrated. The memory cell 100(1) includes a resistor 102, a voltage source $V_{DD}$ 104, tunnel diodes 106(1) and 106(2) and a sense node 108, although the memory cell 100(1) could comprise other types and numbers of components, devices, and/or systems configured in other manners.

The resistor $R_L$ 102 provides the load for the memory cell 100(1) and is coupled in series between the voltage source $V_{DD}$ 104 and the cathode of tunnel diode 106(1), although other numbers and types of loads could be used. The anodes of the tunnel diodes 106(1) and 106(2) are coupled together to form an ambipolar structure and a cathode of tunnel diode 106(2) is coupled to ground, although other numbers and types of diodes coupled together in other manners, such as in a unipolar structure, could be used. The sense node 108 is coupled between the resistor $R_L$ 102 and the cathode of tunnel diode 106(1). The voltage source $V_{DD}$ 104 provides six different voltages that each drive the sense node 108 to one of four substantially stable logic states based on the particular voltage output by the voltage source $V_{DD}$ 104, although other numbers and types of driving systems and other numbers and types of voltage sources which provide other voltages and drive the sense node 108 to other numbers of substantially stable logic states could be used. Additionally, a dual power supply at +0.8 V and −0.8 V that is connected to voltage source $V_{DD}$ 104 are used to provide a standby current during the first and third quadrant operations, respectively, although other types and numbers of powers supplies providing other voltages could be used.

Figure 4:
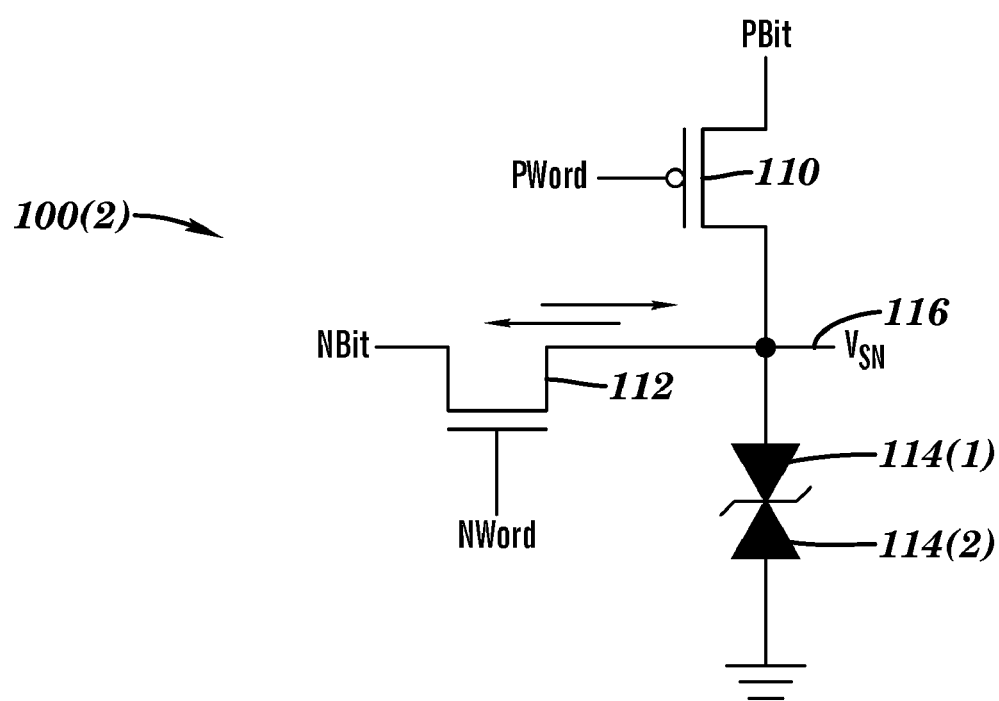
FIG. 4 is an ambipolar memory cell with a FET load in accordance with other embodiments of the present invention.

Referring to FIG. 4, an ambipolar memory cell 100(2) with a FET load in accordance with other embodiments of the present invention is illustrated. The memory cell 100(2) includes a PFET 110, an NFET 112, tunnel diodes 114(1) and 114(2), and a sense node 116, although the memory cell 100(2) could comprise other types and numbers of components, devices, and/or systems configured in other manners.

The PFET 110 and the NFET 112 each have a source which is coupled to the sense node 116 and to the anode of tunnel diode 114(1). The PFET 110 acts as the load and the NFET 112 acts as the driver in the $3^{rd}$ quadrant and the NFET 112 acts as the load and the PFET 110 acts as the driver in the $1^{st}$ quadrant, although other numbers and types of loads and drivers, such as other numbers and types of FETS or resistors, and other arrangements for the load and driver in the different quadrants could be used. The gate and the drain of the PFET 110 are named PWord and PBit, respectively, and the gate and the drain of the NFET 112 are called NWord and NBit, respectively. The PFET 110 and the NFET 112 alternatively drive the sense node 116 to one of four substantially stable logic states at least based on the inputs to the gates and drains of the PFET 110 and the NFET 112, although other numbers and types of driving systems to drive the sense node 116 to other numbers of substantially stable logic states could be used.

Cathodes of the tunnel diodes 114(1) and 114(2) are coupled together to form an ambipolar structure with an anode of tunnel diode 114(2) coupled to ground, although other numbers and types of diodes coupled together in other manners, such as in a unipolar structure, could be used. The sense node 116 is coupled to the sources of the PFET 110 and the NFET 112 and to the anode of tunnel diode 114(1).

Figure 7:
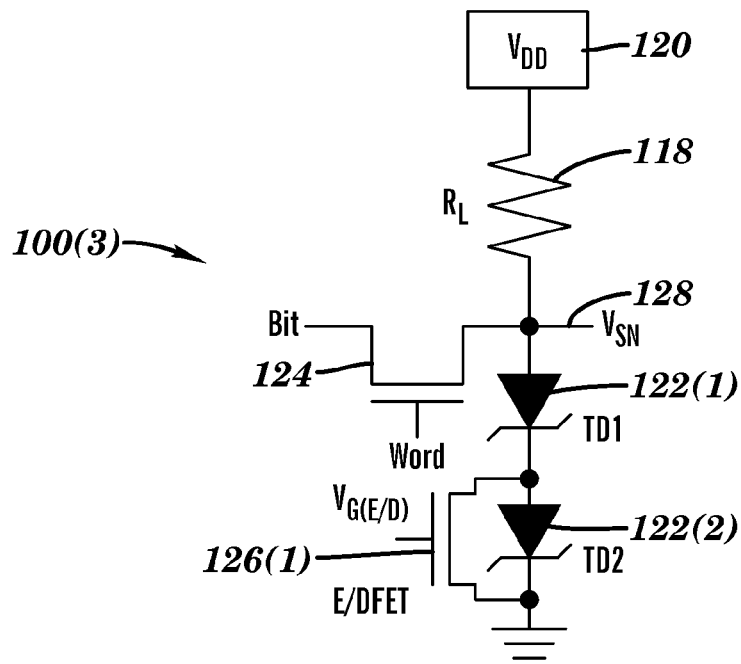
FIG. 7 is a memory cell with a resistive load and an enable/disable (E/D) FET in accordance with other embodiments of the present invention.

Referring to FIG. 7, a memory cell 100(3) with a resistive load and an E/D FET in accordance with other embodiments of the present invention is illustrated. The memory cell 100(3) includes a resistor $R_L$ 118, a voltage source $V_{DD}$ 120, tunnel diodes 122(1) and 122(2), a FET 124, an E/D FET 126(1), and a sense node 128, although the memory cell 100(3) could comprise other types and numbers of components, devices, and/or systems configured in other manners.

The resistor $R_L$ 118 provides the load for the memory cell 100(3) and is coupled in series between the voltage source $V_{DD}$ 120 and the anode of tunnel diode 122(1), although other numbers and types of loads could be used. The voltage source $V_{DD}$ 120 provides a fixed reference voltage, although other numbers and types of voltage sources which provide other voltages could be used. A cathode of tunnel diode 122(1) is coupled to an anode of tunnel diode 122(2) to form a unipolar structure, although other numbers and types of diodes coupled together in other manners, such as in an ambipolar structure, could be used. An anode of tunnel diode 122(1) is coupled to the resistor $R_L$ 118, a source of the FET 124, and the sense node 128 and a cathode of tunnel diode 122(2) is coupled to ground, although other types of connections could be used. The gate and the drain of the FET 124 are named Word and Bit, respectively. The E/D FET 126(1) is coupled in parallel with the tunnel diode 122(2), although other numbers and types of E/D FETs in other locations could be used. The FET 124 and the E/D FET 126(1) act as the driver for the memory cell 100(3) to drive the sense node 128 to one of three substantially stable logic states at least based on the inputs to the gates and drains of the FET 124 and the E/D FET 126(1), although other numbers and types of driving systems to drive the sense node 128 to other numbers of substantially stable logic states could be used. In this particular embodiment, the FET 124 and the E/D FET 126(1) each comprise an NFET, although other numbers and types of components could be used for either or both FETS, such as a PFET.

Figure 10:
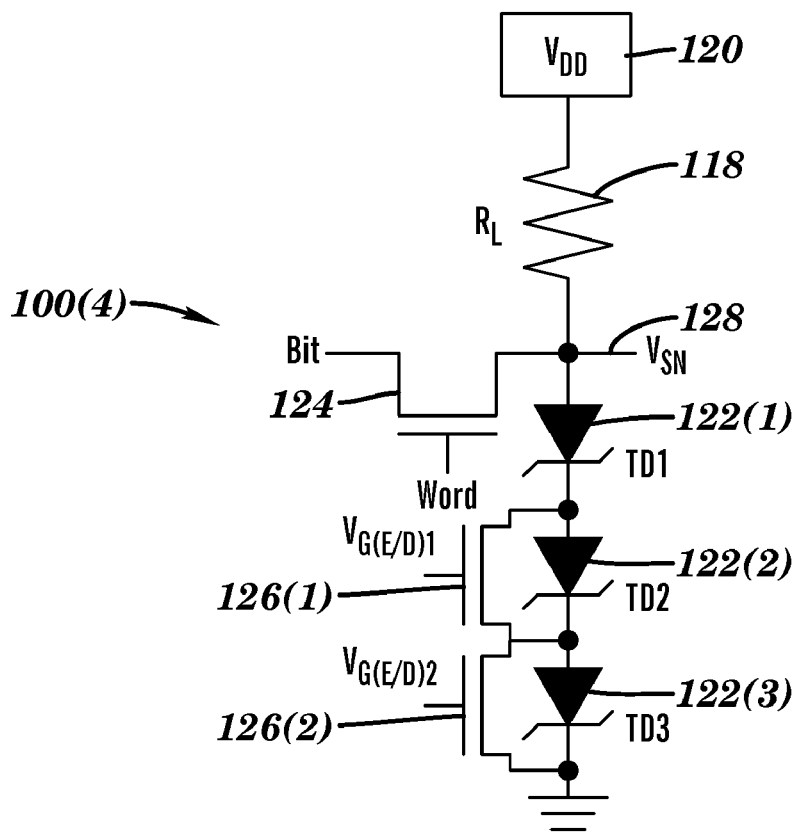
FIG. 10 is a memory cell with a resistive load and two E/D FETs in accordance with other embodiments of the present invention.
Figure 11:
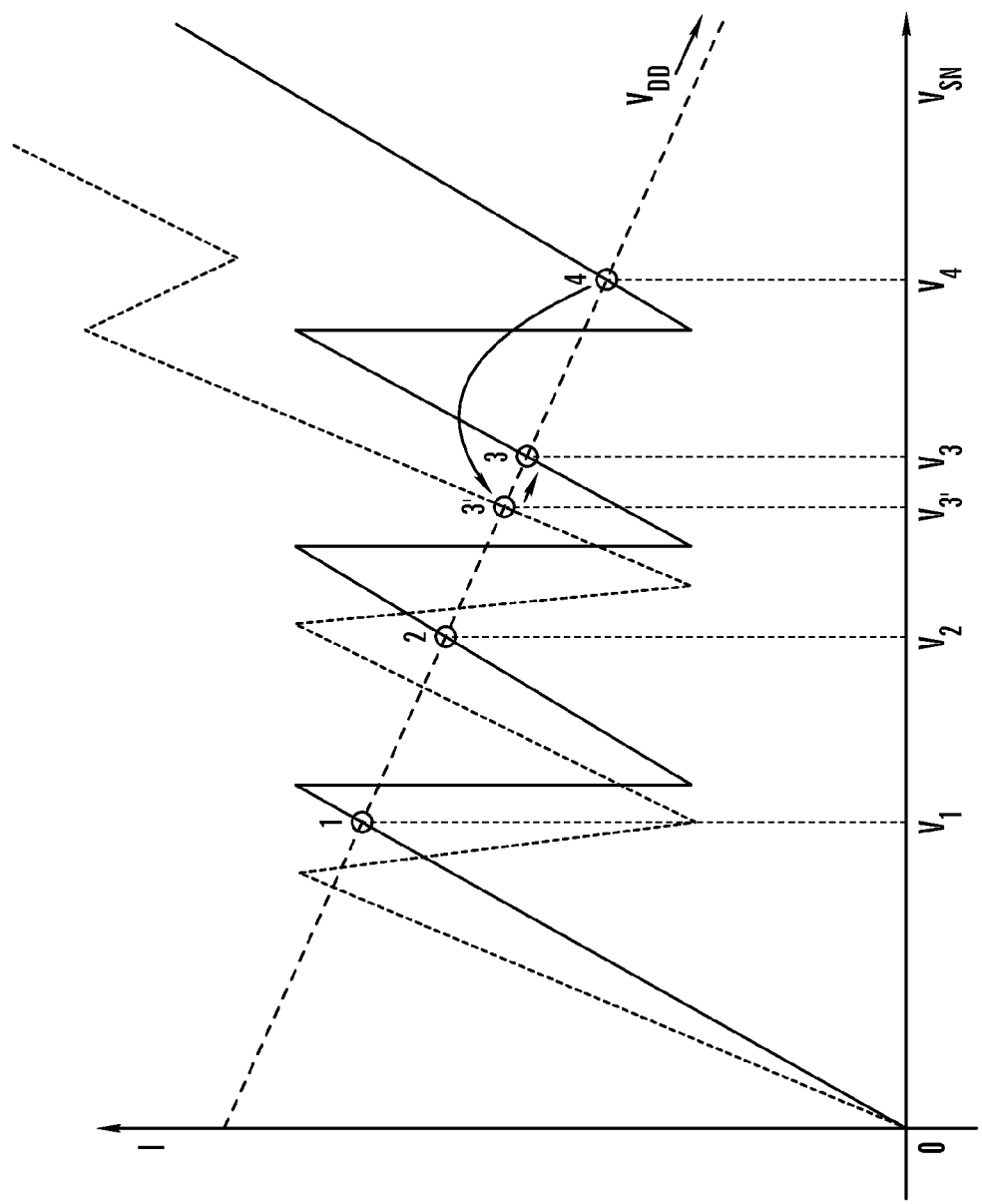
FIG. 11 is a graph of the current-voltage load line analysis from the fourth state to the third state of the memory cell with the resistive load and the two E/D FET shown in FIG. 10.

Referring to FIG. 10, a memory cell 100(4) with a resistive load and two E/D FETs in accordance with other embodiments of the present invention is illustrated. The memory cell 100(4) includes a resistor $R_L$ 118, a voltage source $V_{DD}$ 120, tunnel diodes 122(1)-122(3), a FET 124, E/D FETs 126(1) and 126(2), and a sense node 128, although the memory cell 100(4) could comprise other types and numbers of components, devices, and/or systems configured in other manners.

The resistor $R_L$ 118 provides the load for the memory cell 100(4) and is coupled in series between the voltage source $V_{DD}$ 120 and the anode of tunnel diode 122(1), although other numbers and types of loads could be used. The voltage source $V_{DD}$ 120 provides a fixed reference voltage, although other numbers and types of voltage sources which provide other voltages could be used. A cathode of tunnel diode 122(1) is coupled to an anode of tunnel diode 122(2) and a cathode of tunnel diode 122(2) is coupled to an anode of tunnel diode 122(3) to form a unipolar structure, although other numbers and types of diodes coupled together in other manners, such as in an ambipolar structure, could be used. An anode of tunnel diode 122(1) is coupled to the resistor $R_L$ 118, a source of the FET 124, and the sense node 128 and a cathode of tunnel diode 122(2) is coupled to ground, although other types of connections could be used. The gate and the drain of the FET 124 are named Word and Bit, respectively. The E/D FET 126(1) is coupled in parallel with the tunnel diode 122(2) and the E/D FET 126(2) is coupled in parallel with tunnel diode 122(3), although other numbers and types of E/D FETs in other locations could be used. The FET 124, the E/D FET 126(1), and the E/D FET 126(2) act as the driver for the memory cell 100(4) to drive the sense node 128 to one of four substantially stable logic states at least based on the inputs to the gates and drains of the FET 124, the E/D FET 126(1), and the E/D FET 126(2), although other numbers and types of driving systems to drive the sense node 128 to other numbers of substantially stable logic states could be used.

Figure 14:
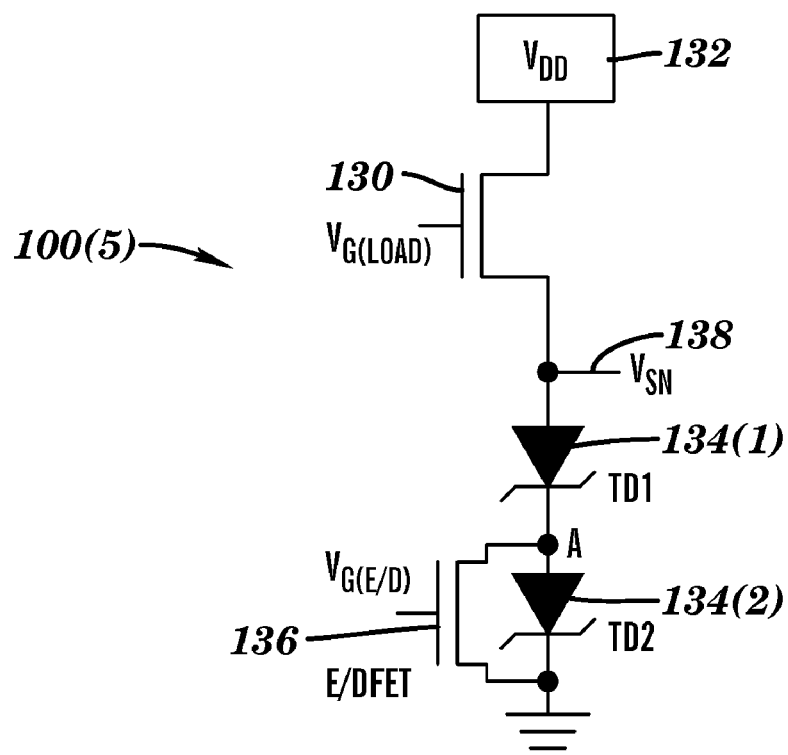
FIG. 14 is a memory cell with a FET load and an E/D FET in accordance with other embodiments of the present invention.

Referring to FIG. 14, a memory cell 100(5) with a FET load and an E/D FET in accordance with other embodiments of the present invention is illustrated. The memory cell 100(5) includes a FET 130, a voltage source $V_{DD}$ 132, tunnel diodes 134(1) and 134(2), an E/D FET 136, and a sense node 138, although the memory cell 100(5) could comprise other types and numbers of components, devices, and/or systems configured in other manners.

The FET 130 provides the load for the memory cell 100(5) and has a drain coupled to the voltage source $V_{DD}$ 132, a source coupled to the anode of tunnel diode 134(1) and to the sense node 138, and a gate named $V_G$, although other numbers and types of loads could be used. The voltage source $V_{DD}$ 132 provides a fixed reference voltage, although other numbers and types of voltage sources which provide other voltages could be used. A cathode of tunnel diode 134(1) is coupled to an anode of tunnel diode 134(2) to form a unipolar structure, although other numbers and types of diodes coupled together in other manners, such as in an ambipolar structure, could be used. An anode of tunnel diode 134(1) is coupled to the source of FET 130 and the sense node 138 and a cathode of tunnel diode 134(2) is coupled to ground, although other types of connections could be used. The E/D FET 136 is coupled in parallel with the tunnel diode 134(2), although other numbers and types of E/D FETs in other locations could be used. The E/D FET 136 acts as the driver for the memory cell 100(5) to drive the sense node 138 to one of three substantially stable logic states at least based on the inputs to the gates and drains of the E/D FET 136, although other numbers and types of driving systems to drive the sense node 138 to other numbers of substantially stable logic states could be used. Additionally, in this particular embodiment the FET 130 and the E/D FET 136 each comprise an NFET, although other numbers and types of components could be used for either or both FETS, such as a PFET.

Figure 17:
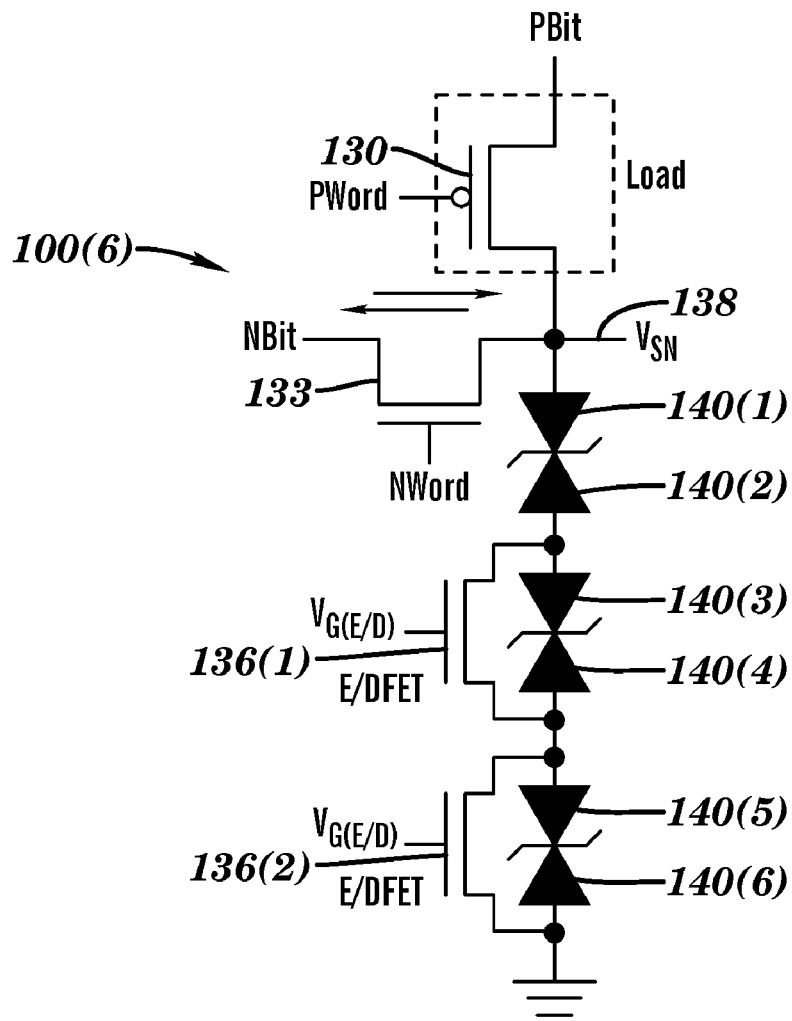
FIG. 17 is an ambipolar memory cell with a FET load and E/D FETs in accordance with other embodiments of the present invention.

Referring to FIG. 17, an ambipolar memory cell 100(6) with a FET load and an E/D FET in accordance with other embodiments of the present invention is illustrated. The memory cell 100(6) includes a PFET 130, an NFET 133, E/D FETs 136(1)-136(2), a sense node 138, and tunnel diodes 140(1)-140(6), although the memory cell 100(6) could comprise other types and numbers of components, devices, and/or systems configured in other manners.

The PET 130 provides the load for the memory cell 100(6) and has a drain also labeled PBit, a source also labeled PWord, and a source coupled to the sense node 138, a source of the NFET 133, and an anode of tunnel diode 140(1), although other numbers and types of loads could be used. A cathode of tunnel diode 140(1) is coupled to a cathode of tunnel diode 140(2) to form a first ambipolar structure, a cathode of tunnel diode 140(3) is coupled to a cathode of tunnel diode 140(4) to form a second ambipolar structure, and a cathode of tunnel diode 140(5) is coupled to a cathode of tunnel diode 140(6) to form a third ambipolar structure, although other numbers and types of diodes coupled together in other manners, such as in a unipolar structure, could be used. An anode of tunnel diode 140(1) is coupled to the source of PFET 130, the source of NFET 133, and the sense node 138, an anode of diode 140(2) is coupled to an anode of diode 140(3), an anode of tunnel diode 140(4) is coupled to an anode of tunnel diode 140(5), and an anode of tunnel diode 140(6) is coupled to ground, although other types of connections could be used. The E/D FET 136(1) is coupled in parallel with the tunnel diodes 140(3) and 140(4) and the E/D FET 136(2) is coupled in parallel with the tunnel diodes 140(5) and 140(6), although other numbers and types of E/D FETs in other locations could be used. The NFET 133 and the E/D FET 136(1)-136(2) act as the driver for the memory cell 100(6) to drive the sense node 138 to one of eight substantially stable logic states at least based on the inputs to the gates and drains of the NFET 133 and the E/D FET 136(1)-136(2), although other numbers and types of driving systems to drive the sense node 138 to other numbers of substantially stable logic states could be used. Additionally, other numbers and types of components could be used for PFET 130, NFET 133, and E/D FETS 136(1)-136(2).

Figure 19:
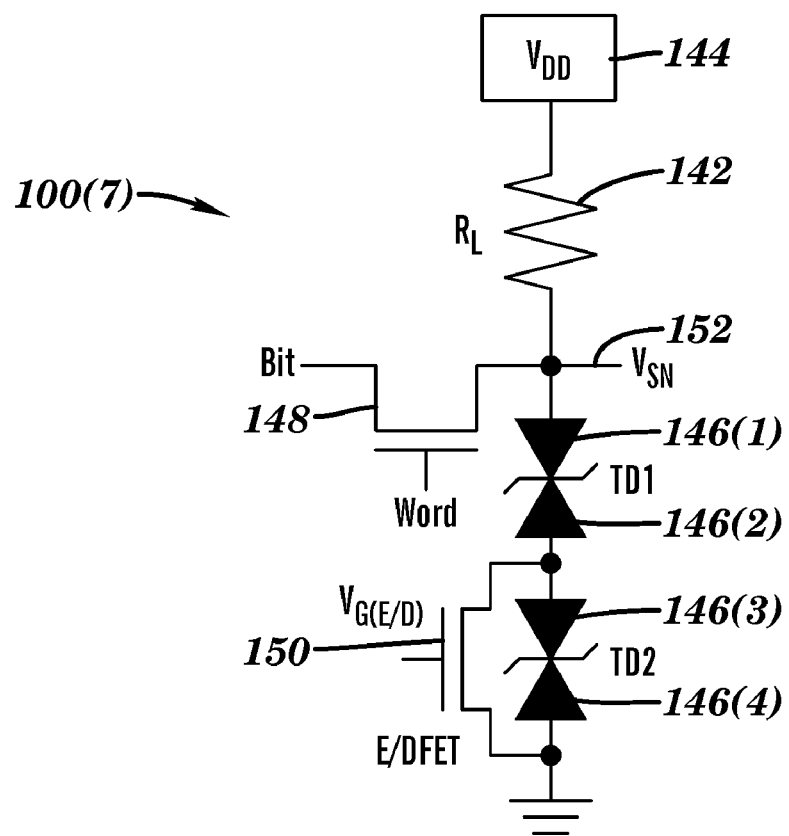
FIG. 19 is an ambipolar memory cell with a resistive load and an E/D FET in accordance with other embodiments of the present invention.

Referring to FIG. 19, an ambipolar memory cell 100(7) with a resistive load and an E/D FET in accordance with other embodiments of the present invention is illustrated. The memory cell 100(7) includes a resistor $R_L$ 142, a voltage source $V_{DD}$ 144, tunnel diodes 146(1)-146(4), a FET 148, E/D FET 150, and a sense node 152, although the memory cell 100(7) could comprise other types and numbers of components, devices, and/or systems configured in other manners.

The resistor $R_L$ 142 provides the load for the memory cell 100(4) and is coupled in series between the voltage source $V_{DD}$ 120 and the anode of tunnel diode 122(1), although other numbers and types of loads could be used. The voltage source $V_{DD}$ 144 provides two different voltages that help drive the sense node 108 to one of six substantially stable logic states based partially on the particular voltage output by the voltage source $V_{DD}$ 144, although other numbers and types of driving systems and other numbers and types of voltage sources which provide other voltages to drive the sense node 152 to other numbers of substantially stable logic states could be used. A cathode of tunnel diode 146(1) is coupled to a cathode of tunnel diode 146(2) to form a first ambipolar structure and a cathode of tunnel diode 146(3) is coupled to a cathode of tunnel diode 146(4) to form a second ambipolar structure, although other numbers and types of diodes coupled together in other manners, such as in a unipolar structure, could be used. An anode of tunnel diode 146(1) is coupled to the resistor $R_L$ 142, a source of the FET 148, and the sense node 152 and a cathode of tunnel diode 146(4) is coupled to ground, although other types of connections could be used. The gate and the drain of the FET 148 are named Word and Bit, respectively. The E/D FET 150 is coupled in parallel with the tunnel diodes 146(3) and 146(4), although other numbers and types of E/D FETs in other locations could be used. The voltage source 144, FET 148, and the E/D FET 150 act as the driver for the memory cell 100(7) to drive the sense node 152 to one of six substantially stable logic states, although other numbers and types of driving systems to drive the sense node 152 to other numbers of substantially stable logic states could be used.

The operation of each of the memory cells 100(1)-100(7) will now be described with reference to FIGS. 1-21 below. With respect to these descriptions, the particular values for the components, inputs, and outputs are by way of example only and these values can change.

Figure 2:
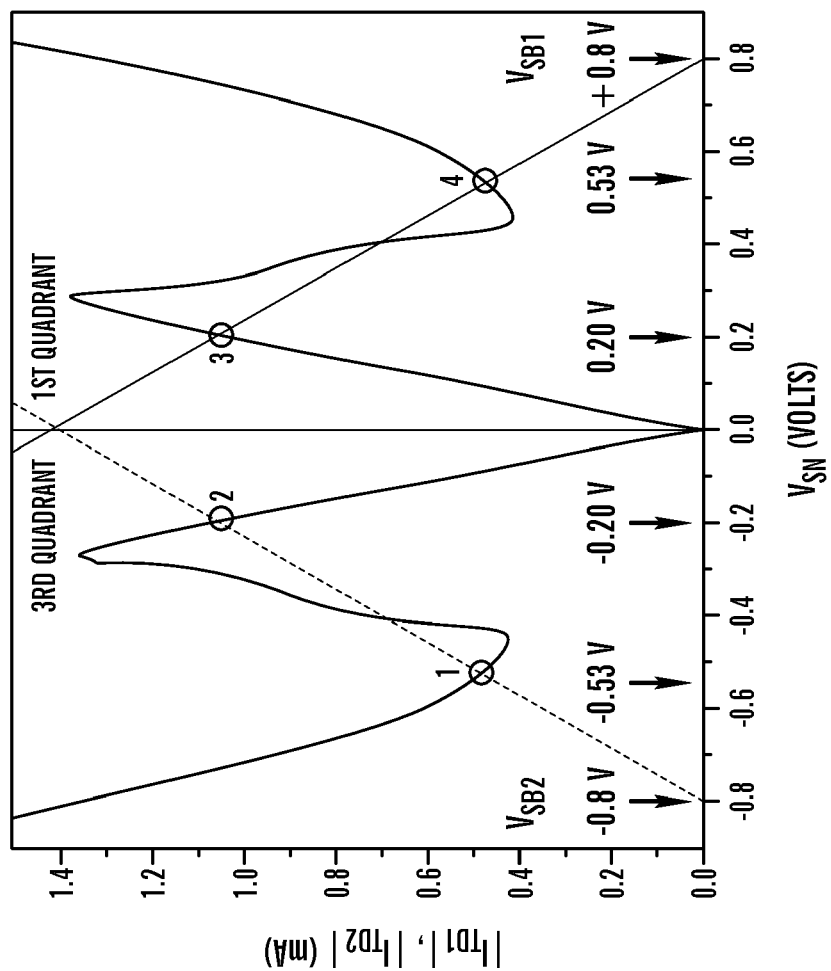
FIG. 2 is a graph of current-voltage load line analysis of the ambipolar memory cell with the resistive load shown in FIG. 1.
Figure 3:
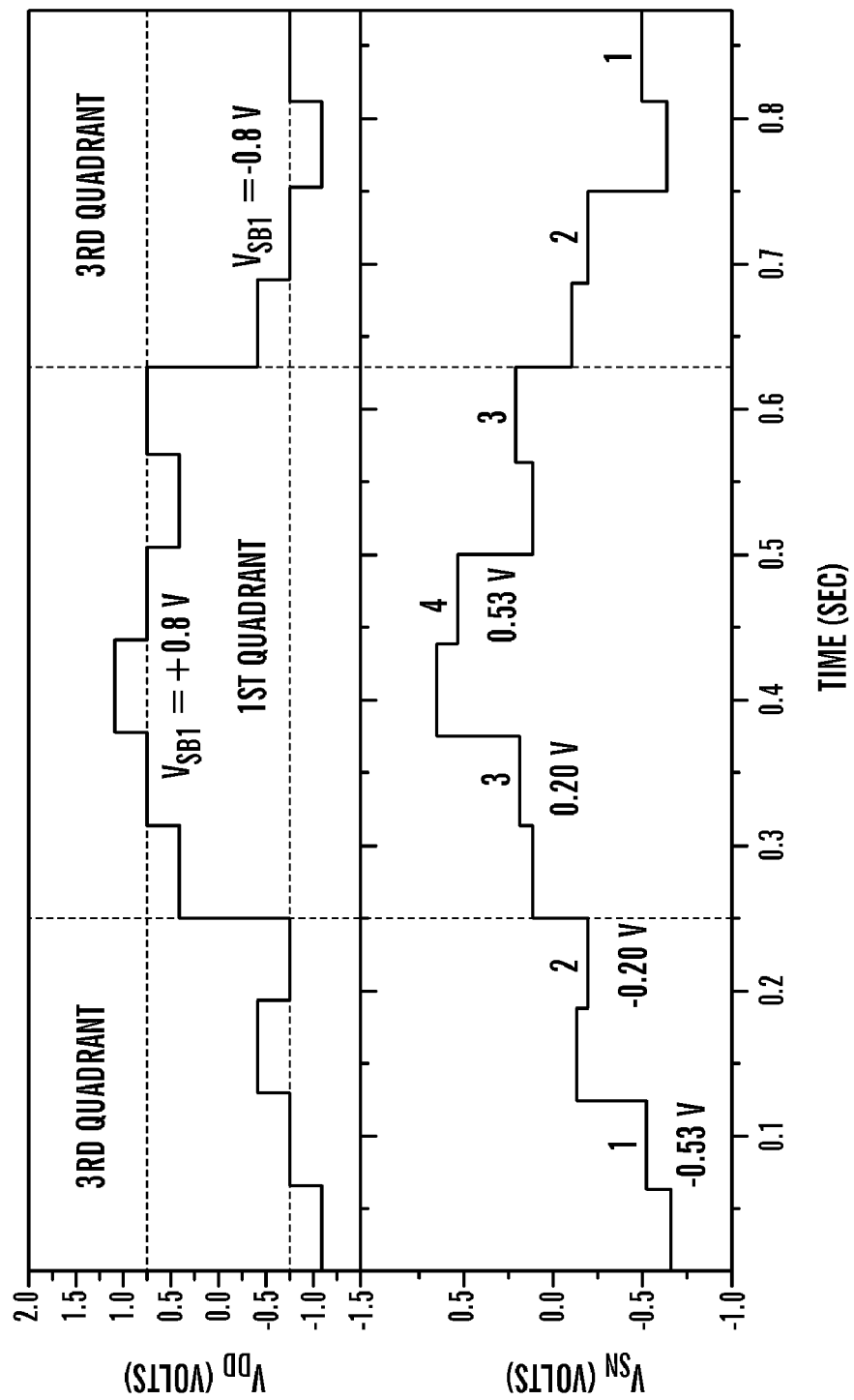
FIG. 3 is a timing diagram of biasing conditions during writing high, write low, and standby operation of the ambipolar memory cell with the resistive load shown in FIG. 1.

Referring to FIGS. 1-3, the operation of memory cell 100(1) will now be described. In this particular example, two power supply voltages were chosen at +0.8 V and −0.8 V to provide a standby current during the first and third quadrant operations, respectively. At these two standby load lines, the possible latching points are located at −0.53 V, −0.20 V, +0.20 V, and +0.53 V as illustrated in FIG. 2. The timing diagram in FIG. 3 shows the biasing conditions during writing high, write low, and standby operation of memory cell 100(1) to switch from one logic state to another. In this particular example, the voltage source $V_{DD}$ 104 needs to be altered to change between the four substantially stable, logic states on the sense node 108.

More specifically, to force the sense node 108 for memory cell 100(1) to latch into the first logic state voltage $V_{SN}$ at −0.53 V the voltage source $V_{DD}$ 104 is changed to output −1.1 V. To force the sense node 108 to latch into the second logic state voltage $V_{SN}$ at −0.20 V, voltage source $V_{DD}$ 104 is increased to −0.5 V. At the first and second logic states, the power supply voltage is maintained at −0.8V. To force the sense node 108 to latch into the third logic state voltage $V_{SN}$ at 0.20 V the voltage source $V_{DD}$ 104 is changed to output +0.5 V. To force the sense node 108 to latch into the fourth logic state voltage $V_{SN}$ at 0.53 V, voltage source $V_{DD}$ 104 is increased to +1.1 V. At the third and fourth logic states, the power supply voltage is maintained at +0.8V.

Figure 5:
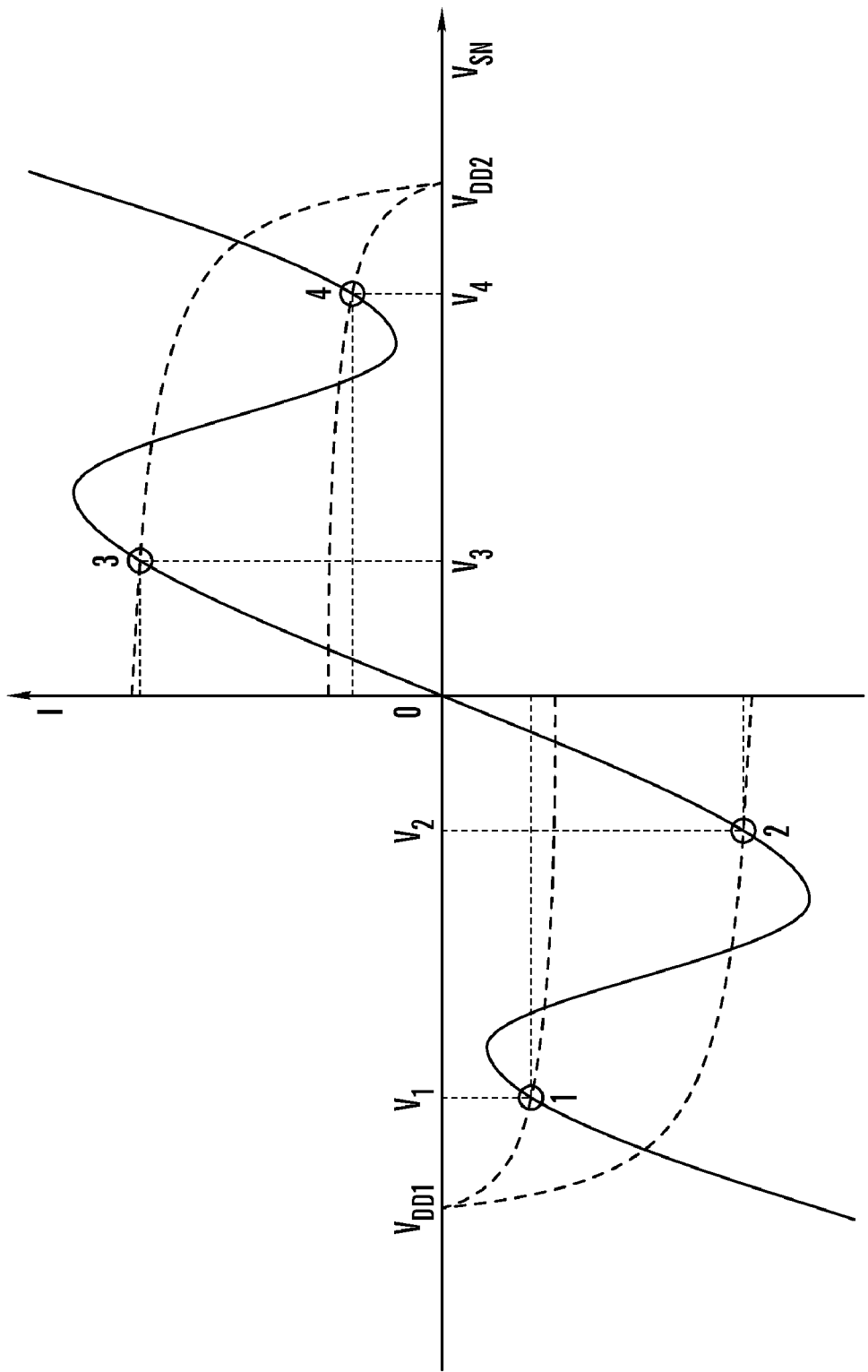
FIG. 5 is a graph of current-voltage load line analysis of the ambipolar memory cell with the FET load shown in FIG. 4.

The operation of memory cell 100(2) will now be described with reference to FIGS. 4-6. In this particular example, the voltage source at drain or PBit can be fixed to its standby values and the switching between the four substantially stable, logic states is done by controlling the inputs to the gate or PWord and drain PBit of FET 110 and the gate or NWord and drain or NBit of the FET 112. In the third quadrant region, the PFET 110 functions as the load element while the NFET 112 controls the current going in and out of and thus the logic state of the sense node 116. In the first quadrant operation, the NFET 112 and PFET 110 exchange roles so that the NFET 112 acts as the load element, while PFET 110 controls the current going in and out of and thus the logic state of the sense node 116.

Figure 6:
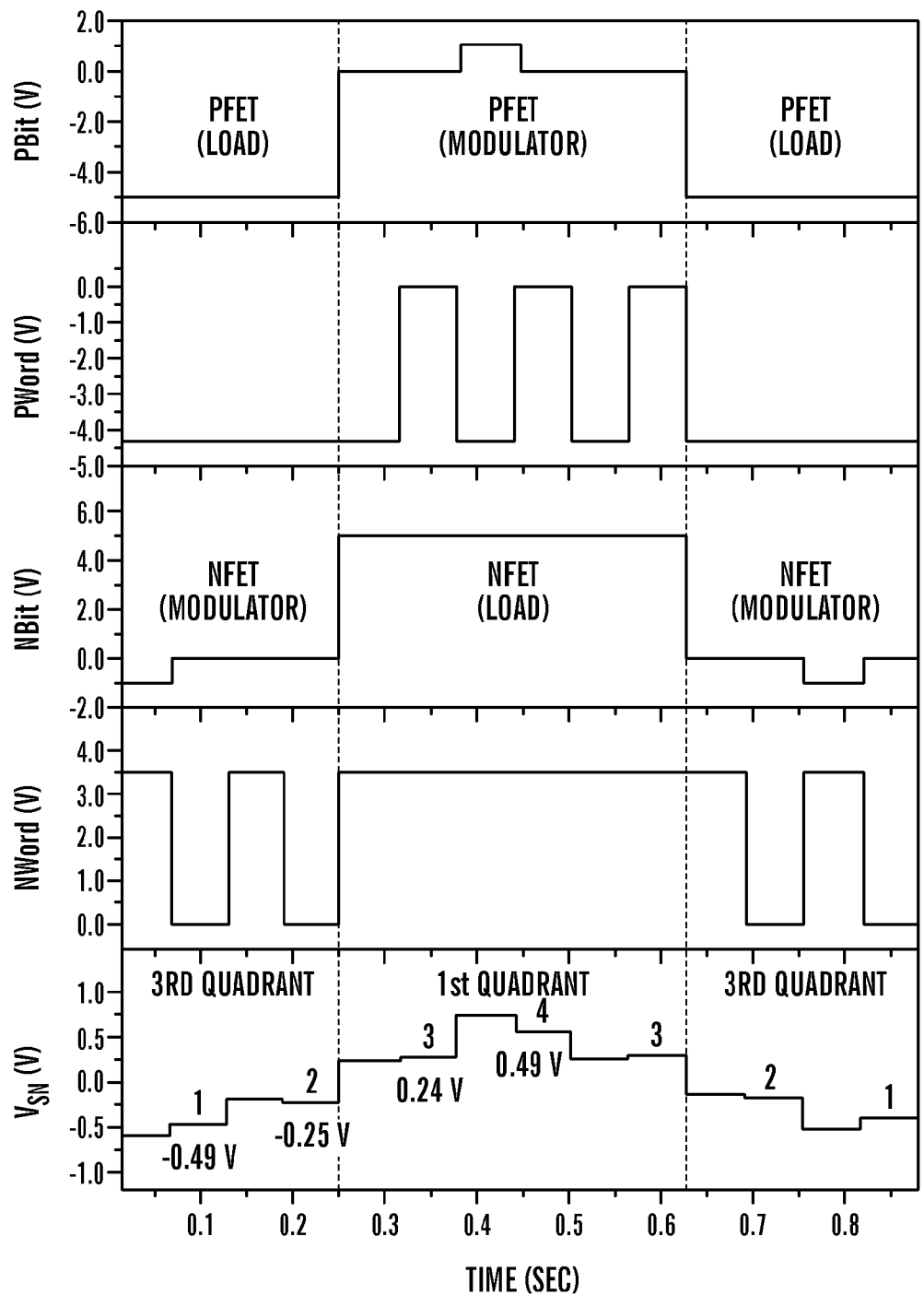
FIG. 6 is a timing diagram of biasing conditions during writing high, write low, and standby operation of the ambipolar memory cell with the FET load shown in FIG. 4.

The timing diagram in FIG. 6 shows the biasing conditions during writing high, write low, and standby operation of memory cell 100(2) to switch from one logic state to another. In the third quadrant operation, Gate or PWord and Drain or PBit of PFET 110 are biased at −4.3 V and −5.0 V, respectively, to provide a standby load on the tunnel diodes 114(1) and 114(2). To force the sense node 116 to latch into the first logic state, the gate or NWord of the NFET 112 is turned on by applying 3.6 V to the gate or NWord. The drain or NBit of NFET 112 has to be biased below the potential of the first logic state in such a way to drain current out of the sense node 116. By doing do, the potential on the sense node 116 is decreased. Once the NFET 110 is turned off, i.e. a third quadrant standby condition, the voltage $V_{SN}$ at the sense node 116 is stabilized at the first logic state at −0.49 V. To write into the second state, the NFET 112 is again turned on, but with drain or Nbit of NFET 112 at 0 V. Since the drain or NBit is at higher potential than voltage $V_{SN}$ at the sense node 116, current is injected into the sense node 116 elevating its potential. As a result, the voltage $V_{SN}$ at the sense node 116 is stabilized at the second logic state at −0.25 V.

In the first quadrant operation, the gate or NWord and drain or NBit of the NFET 112 are biased to 3.6 V and 5.0 V, respectively, to provide a standby load on the tunnel diodes 114(1) and 114(2). PFET 110 controls the current that goes into and out of the sense node 116 during the writing operation. To write from the second logic state to the third logic state, the gate or PWord of the PFET 110 is turned on by applying −4.3 V to the gate and the drain or PBit is left at 0 V because at this point the sense node 116 is still at negative potential. Since the voltage at drain or PBit of PFET 110 is larger than voltage $V_{SN}$ at the sense node 116, current will flow into the sense node 116 through the PFET 110, raising its potential. As a result, the sense node 116 is forced to latch into the third logic state at 0.24 V. To latch into the fourth logic state, drain or PBit of PFET 110 is biased at 1.0 V while the gate or PWord of the PFET 110 is turned on. Once again, current flows into the sense node 116 since drain or PBit of PFET 110 is at higher potential than voltage $V_{SN}$ at the sense node 116. Therefore, latching in the memory cell 100(2) from the third logic state to the fourth logic state at 0.49 V occurs.

Figure 8:
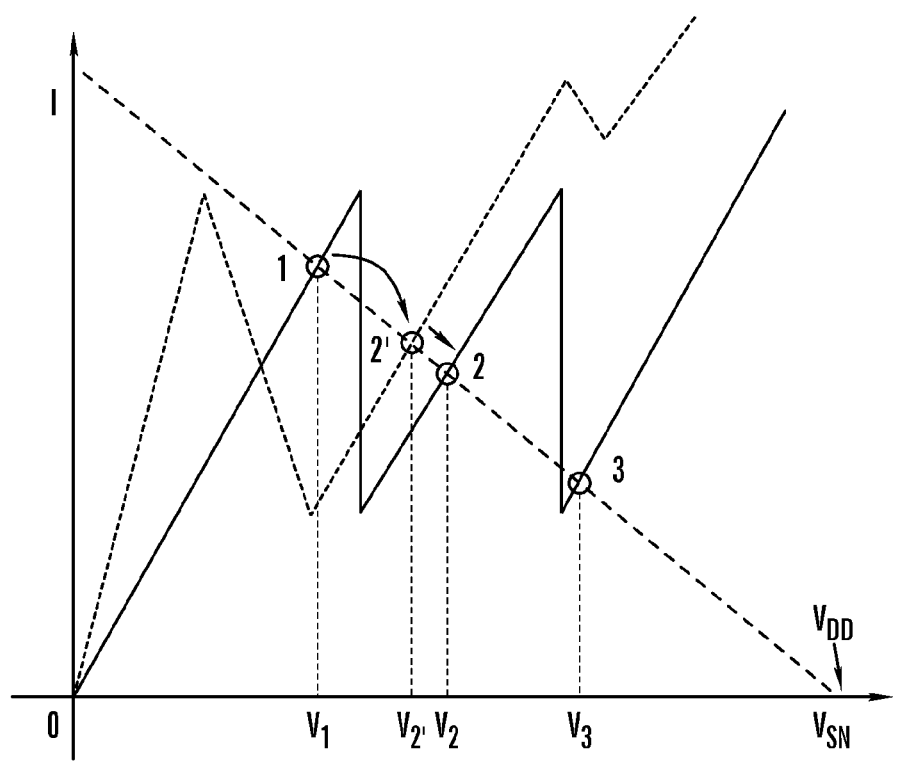
FIG. 8 is a graph of the current-voltage load line analysis of the memory cell with the resistive load and the E/D FET shown in FIG. 7.
Figure 9:
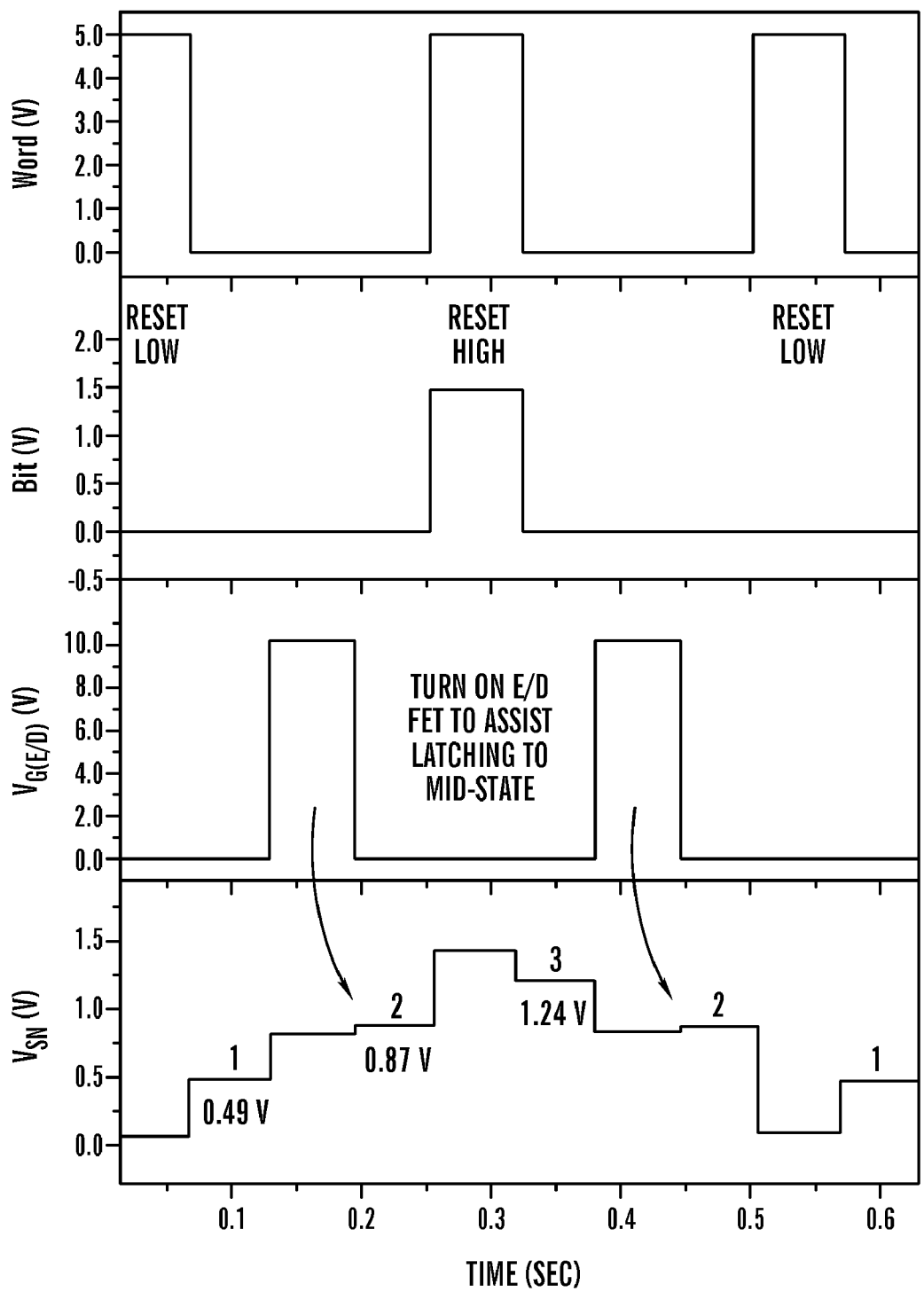
FIG. 9 is a timing diagram of biasing conditions during writing high, write low, and standby operation of the memory cell with the resistive load and the E/D FET shown in FIG. 7.

The operation of memory cell 100(3) will now be described with reference to FIGS. 7-9. In this particular example, the voltage source $V_{DD}$ 120 is biased at 2.2 V to provide a standby current, denoted by the dashed line in the load line analysis graph illustrated in FIG. 8. The standby load line shown by the dashed line intersects with the driver curve shown by the solid line at point $V_1$, $V_2$, and $V_3$, corresponding to logic states 0.48 V, 0.87 V, and 1.24 V in the timing diagram shown for memory cell 100(3) in FIG. 9.

To write into a first logic state in memory cell 100(3), a reset low operation is performed by turning on the gate or Word and grounding the drain or Bit of FET 124. As a result, a current path away from the sense node 128 is created, pulling down the potential at the sense node 120 to latch into the first logic state at 0.48 V. To write into the third logic state, a reset high operation is performed where FET 124 is turned on by applying 5.0 V to the gate or Word and 1.5 V to the drain or Bit. As a result, the potential at the drain or Bit of FET 124 is much higher than the potential at the sense node 128, causing current to flow into the sense node 128. This condition forces the sense node of the memory cell 100(3) to latch into its highest logic state at 1.24 V.

To write into the middle logic state for sense node 128 of memory cell 100(3) is done with the E/D FET 126(1). By turning on the E/D FET 126(1), a shunt current path is created in parallel to tunnel diode 122(2) shorting this tunnel diode 122(2). As a result, the driver characteristic is changed as indicated in the dotted line in FIG. 8. In particular, the first peak is shifted to a lower voltage and the second peak is elevated to a much higher current. The change in the driver characteristics created a condition where the only intersection between driver and load line is at point 2' shown in FIG. 8. Upon restoration to the standby condition, the sense node 128 latched into the nearest stable point at point 2 at 0.87 V. Thus, E/D FET 126(1) assisted the sense node 128 to latch into the middle state.

The operation of memory cell 100(4) will now be described with reference to FIGS. 10-13. In this particular example, the operation of memory cell 100(4) is the same as the operation of memory cell 100(3), except as set forth herein memory cell 100(4) has logic states at 0.60 V, 1.07 V, 1.55 V, and 1.99 V for the sense node 128 of memory cell 100(4). Like the memory cell 100(3), the sense node 128 in memory cell 100(4) can be latched to its lowest and highest state by performing reset low and high operations, respectively. Reset low is done by turning on the gate or Word of FET 124 while grounding the drain or Bit of FET 124. Similarly, reset high is executed by turning on the gate or Word of FET 124 while applying a bias at the drain or Bit line that is much higher than the potential of the highest logic level.

The latching operation to the other logic states in memory 100(4) will now be described from the higher logic state to the lower logic state. As discussed above, the fourth logic state is at 1.99 V. To latch into the third state, E/D FET 126(2) is turned on by applying 10 V at its gate, elevating the third peak to higher current range. From the perspective of the standby load line, the third peak seems like it disappears. As a result the latching point for the logic state moves from the highest logic state to a point located between the third and second peaks shown in FIG. 11. Upon restoring to the standby condition, the sense node 128 is latched to a third logic state at 1.55 V.

Figure 12:
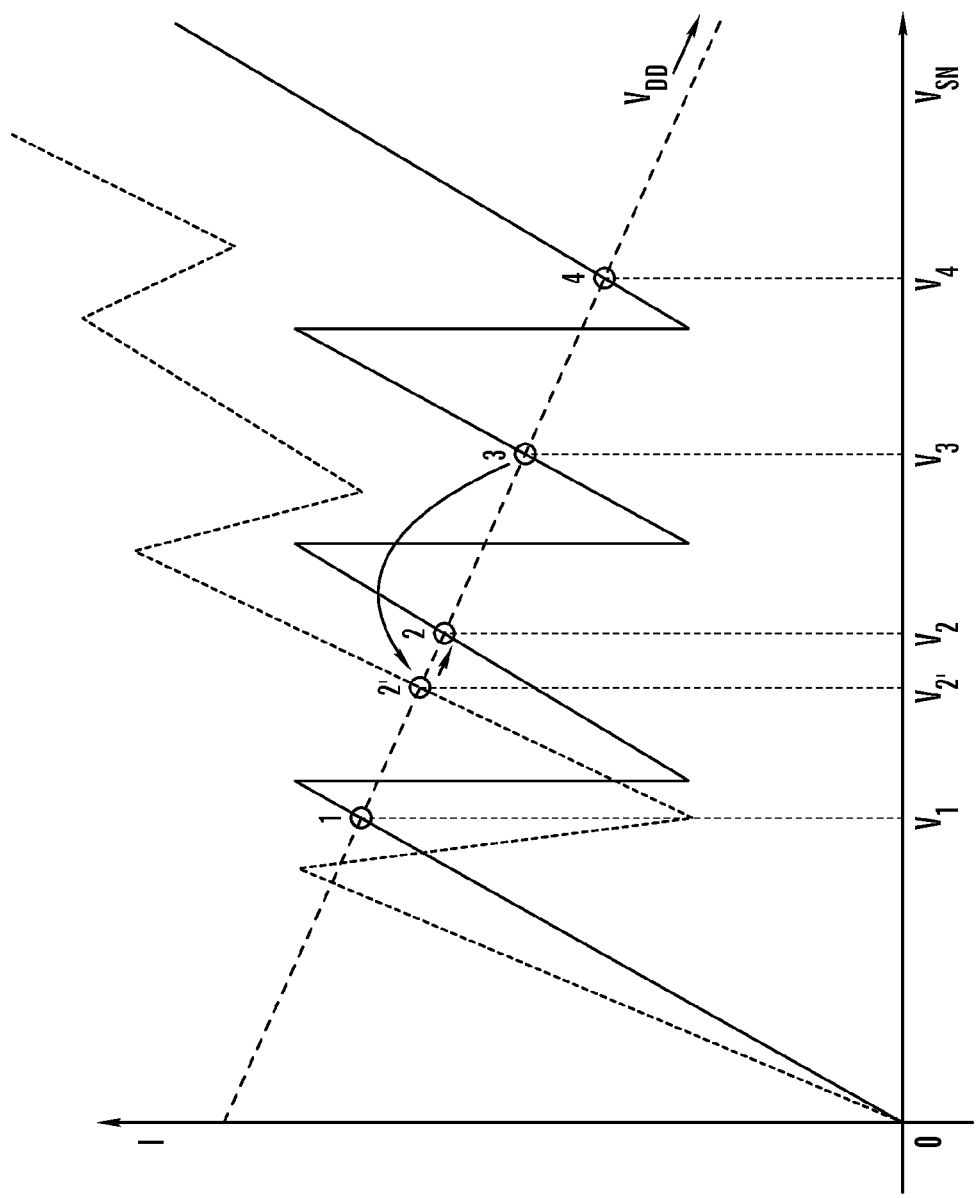
FIG. 12 is a graph of the current-voltage load line analysis from the third state to the second state of the memory cell with the resistive load and the two E/D FET shown in FIG. 10.
Figure 13:
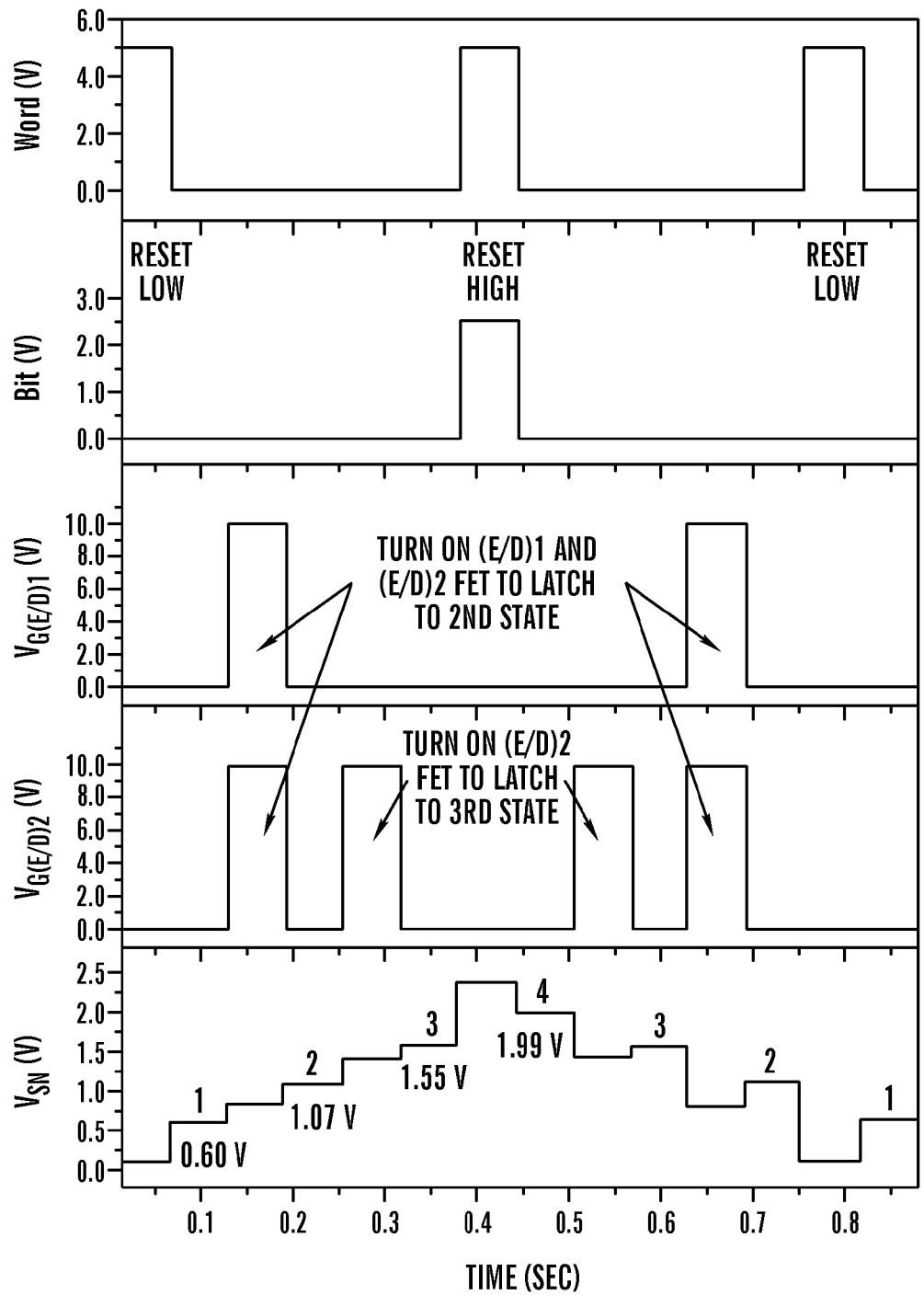
FIG. 13 is a timing diagram of biasing conditions during writing high, write low, and standby operation of the memory cell with the resistive load and the two E/D FET shown in FIG. 10.

In a very similar manner, the latching from the third logic state to second logic state is done by simultaneously turning on both E/D FET 126(1) and FET 126(2). By doing so, both the third and second peaks are elevated to higher current ranges as shown in FIG. 12. At this condition, the sense node 128 only sees the first peak. Therefore, the latching point for the logic state of sense node 128 shifts from point 3 to point 2' that was located between the first and second peak. Subsequently, the latching point for the second logic state of sense node 128 is moved to 1.07 V.

The sense node 128 can be latched to its lowest and highest logic state by performing reset low and high operations, respectively. Reset low is done by turning on the Word line of FET 124 while grounding the Bit line of FET 124. Similarly, reset high is executed by turning on the Word line of FET 124 while applying a bias at the Bit line of FET 124 that is much higher than the potential of the highest logic level.

Figure 15:
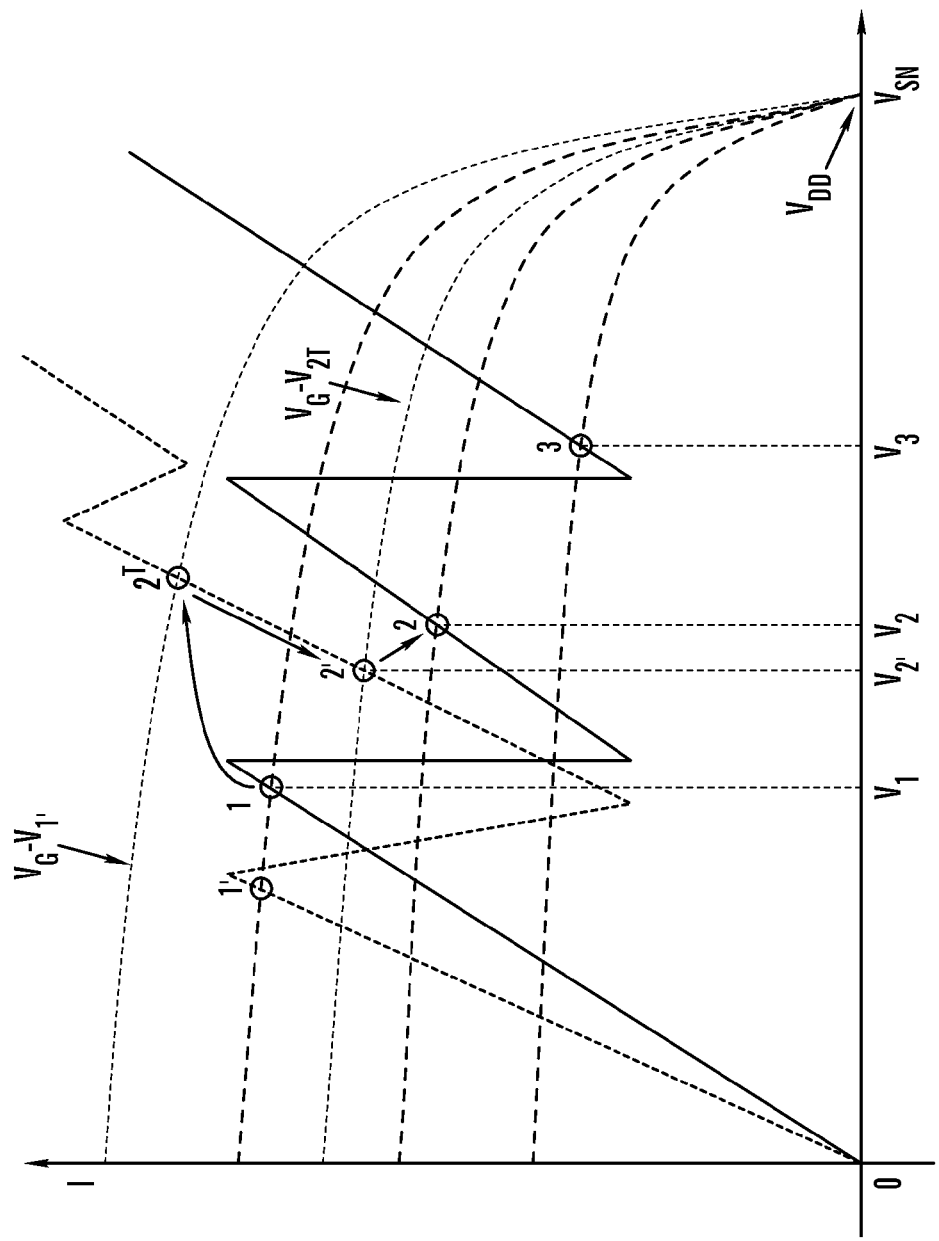
FIG. 15 is a graph of the current-voltage load line analysis of the memory cell with the FET load and the E/D FET shown in FIG. 14.
Figure 16:
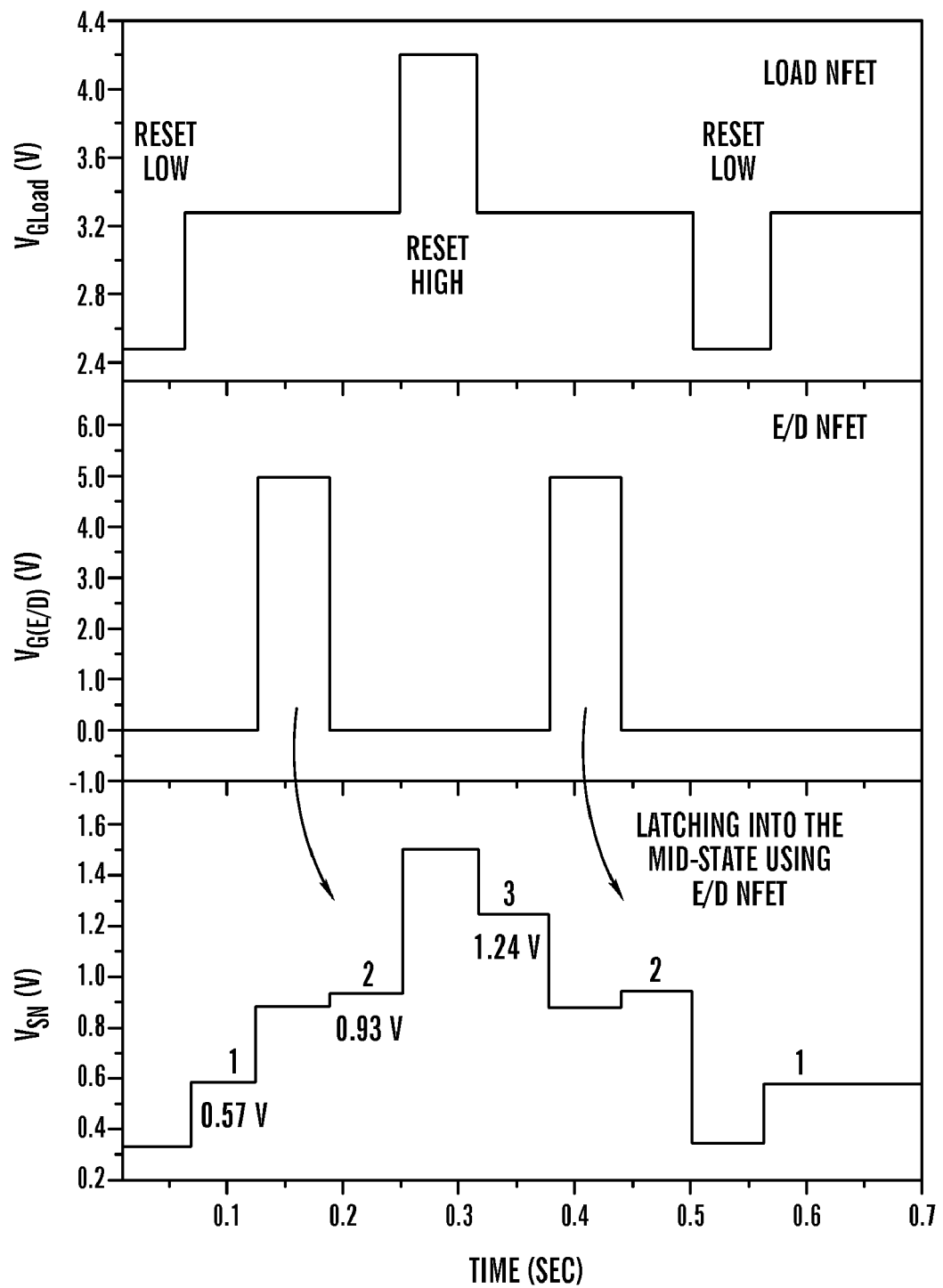
FIG. 16 is a timing diagram of biasing conditions during writing high, write low, and standby operation of the memory cell with the FET load and the E/D FET shown in FIG. 14.

The operation of memory cell 100(5) will now be described with reference to FIGS. 14-16. In this particular example, the I-V load line analysis is illustrated in FIG. 15 and the time diagram of latching sequence during various operations is illustrated in FIG. 16. To provide a standby load line, the gate and drain of the FET 130 are biased at 3.3 V and 3.0 V, respectively. In this particular example, the three possible logic states for sense node 138 are at 0.57 V, 0.93 V, and 1.24 V. The latching process to the lowest and highest logic states for the sense node 138 of memory cell 100(5) is exactly the same as the latching process to the lowest and highest logic states for the sense node 128 of memory cell 100(3) and thus will not be described again here. The latching to middle logic state however is slightly different for the sense node 138 of memory cell 100(5).

The sense node 138 is latched into its lowest state when the memory cell 100(5) is just turned on. To latch into the middle logic state, the E/D FET 136 is turned on to short out and thus disables the operation of tunnel diode 134(2). Additionally, when FET 136 is turned on the potential at point A drops to a lower voltage. As a result, the voltage $V_{SN}$ at the sense node 138 is pulled down to lower potential. This effectively increases the gate-to-source potential of the load FET 130, elevating the load line to higher current range. Therefore, the latching point moves from point 1 to $2^T$ as shown in FIG. 15. The superscript 'T' is used to indicate that this point is very unstable and exist only for a brief period of time during switching.

This change is followed immediately by a sudden change in $V_{GS}$ of the load FET 130 from $V_G-V_1$ to $V_G-V_{2T}$. Therefore, the latching point moves rapidly from point $2^T$ to 2'. Once the E/D FET 136 is turned off, the latching point shifts from point 2' to point 2 at 0.93 V. Accordingly, the latching to the middle logic state for the memory cell 100(5) involves a transitional latching point because the FET functions as an active load.

Figure 18A:
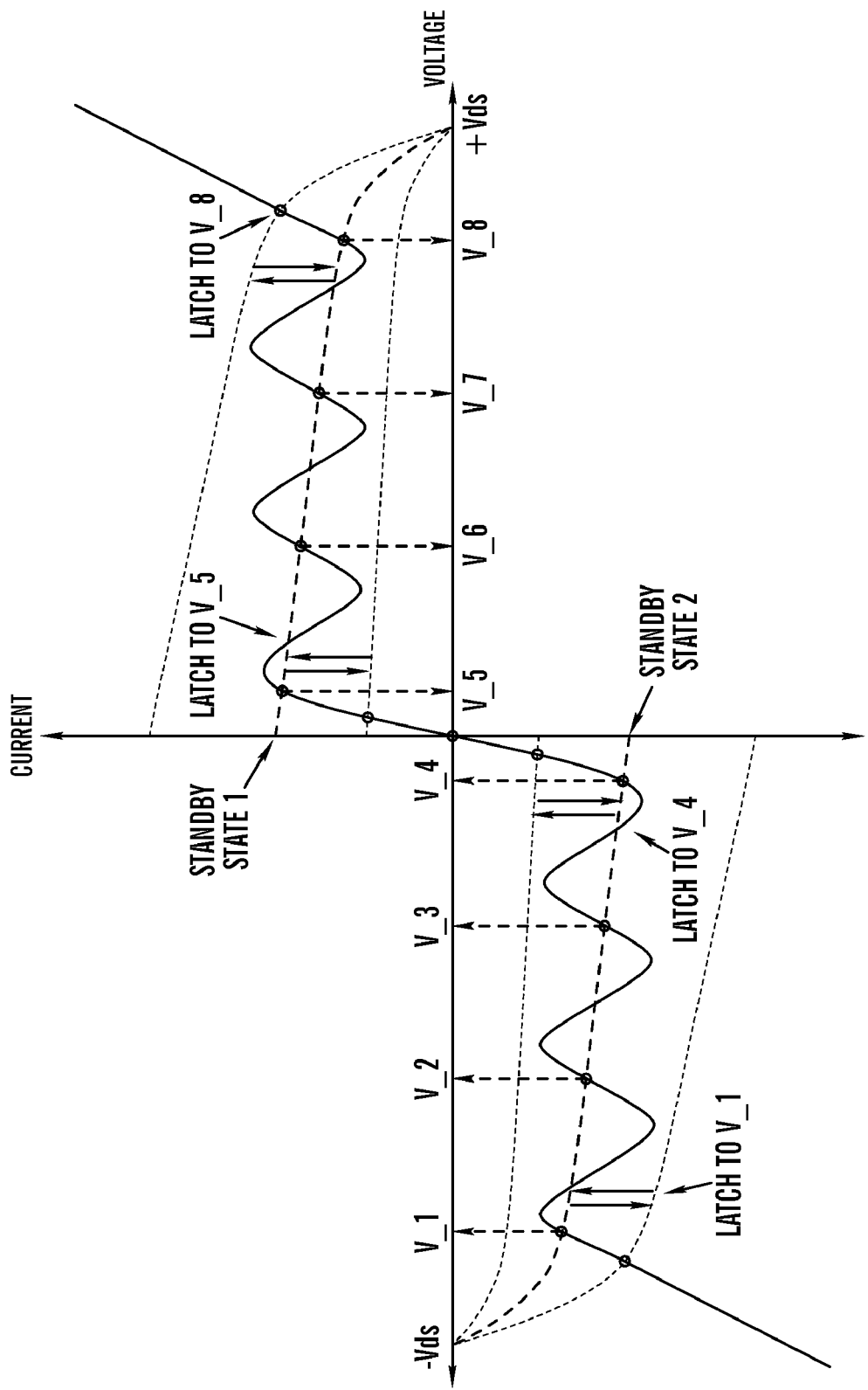
FIG. 18(a) is a graph of the current-voltage load line analysis of the ambipolar memory cell with the FET load and the E/D FET shown in FIG. 17 switching between a highest logic state and a lowest logic state.
Figure 18B:
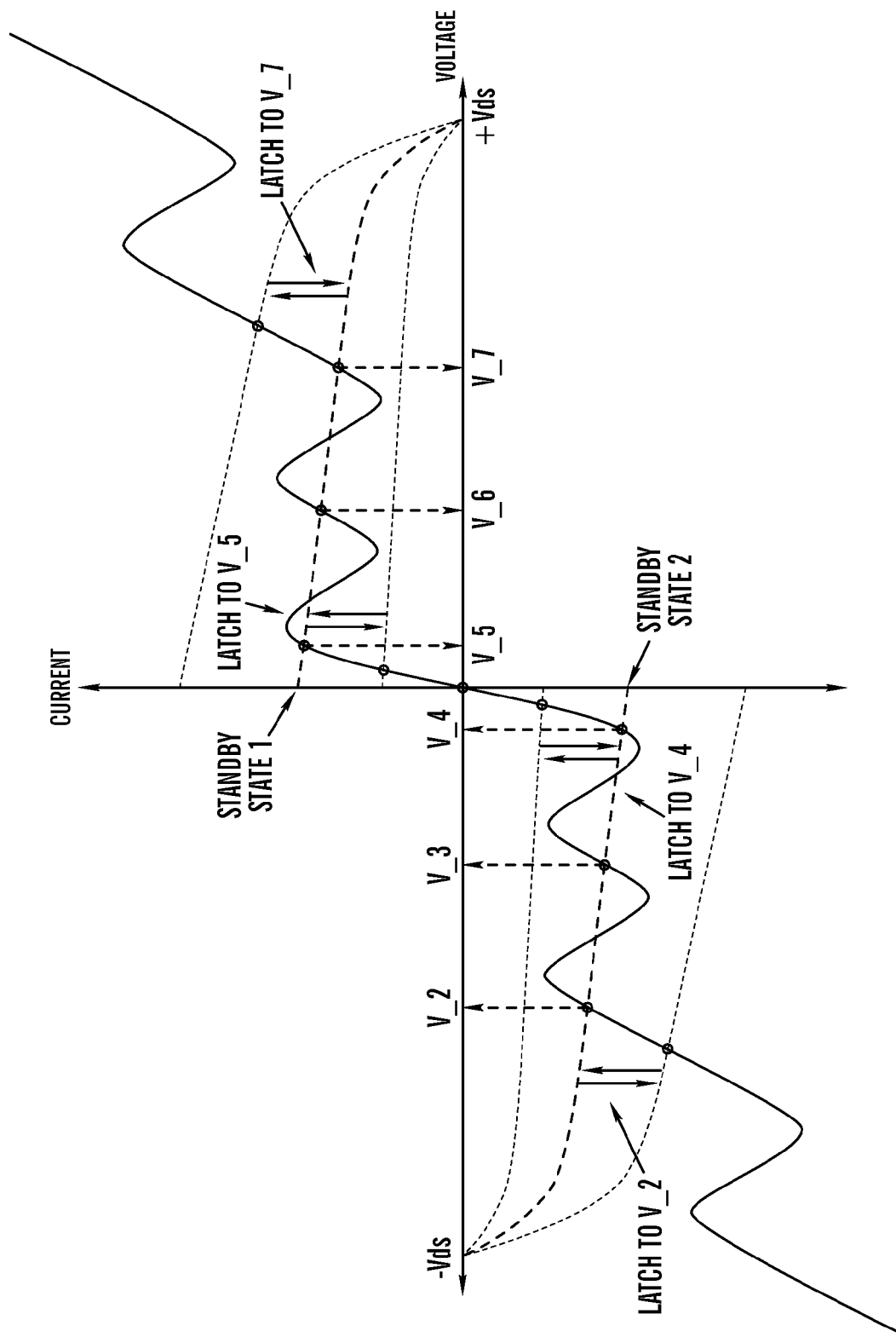
FIG. 18(b) a graph of the current-voltage load line analysis of the ambipolar memory cell with the FET load and the E/D FET shown in FIG. 17 with the E/D FET turned on to switch between two mid-level logic states and the lowest logic state.
Figure 18C:
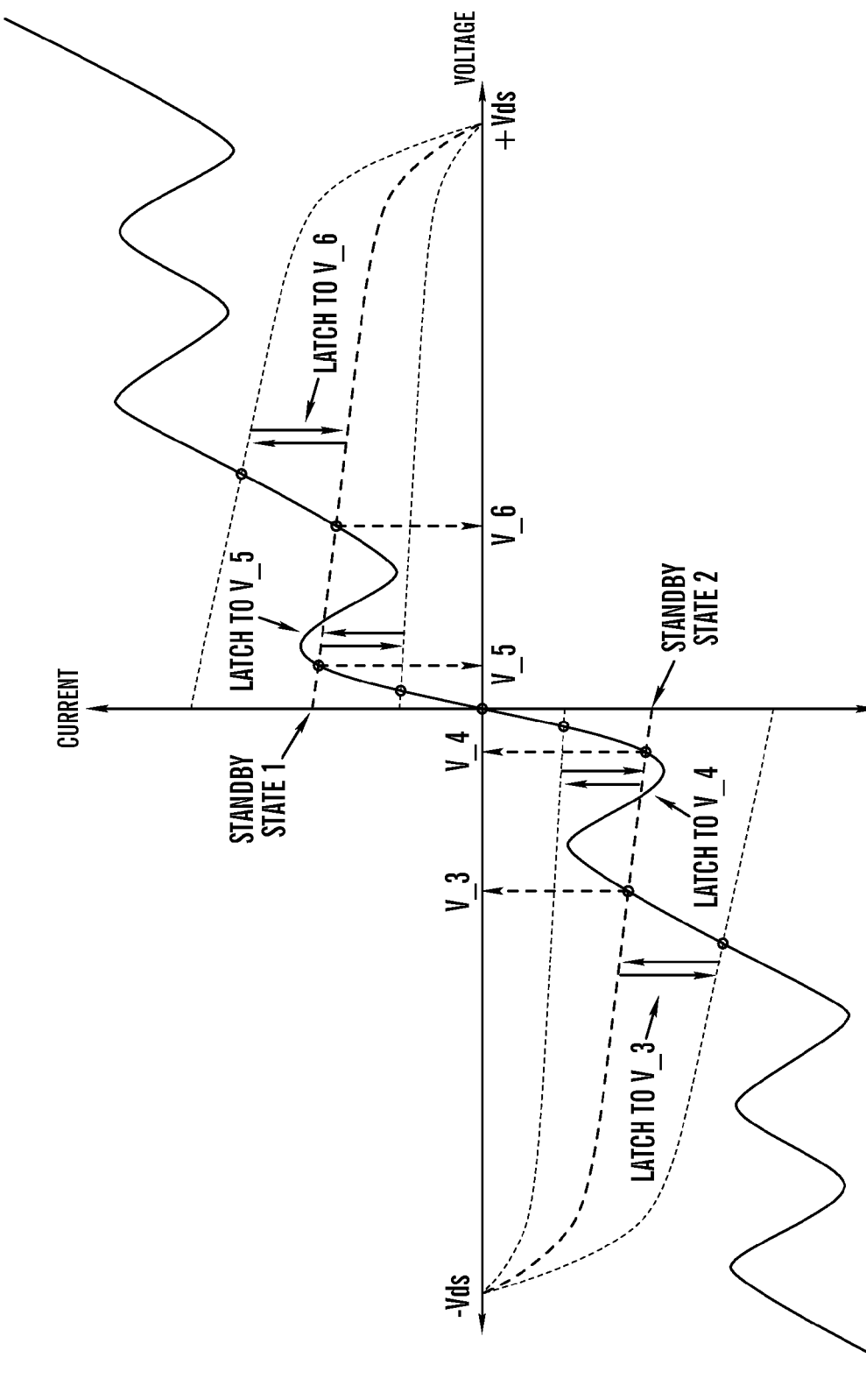
FIG. 18(c) is a graph of a current-voltage load line analysis of the ambipolar memory cell with the FET load and the E/D FET shown in FIG. 17 with both E/D FETs turned on to switch between two other mid-level logic states and the lowest logic state.

The operation of memory cell 100(6) will now be described with reference to FIGS. 17-18. The memory cell 100(6) provides eight logic states by using the combined approach of ambipolar operation and E/D FET. Latching to the highest and lowest available logic states is achieved by the method discussed for memory cell 100(2) in FIG. 4 and thus will not be described again in detail here. For memory cell 100(6), this is illustrated in FIG. 18(*a*), where $+V_{DS}$ and $-V_{DS}$ correspond to, respectively, NBit and PBit in FIG. 17. In the first quadrant, the NMOS acts as the load transistor and the PMOS acts as the driver transistor, while in the third quadrant, the NMOS and PMOS transistors switch roles. Latching to logic states between the lowest and highest states is achieved by turning on one of the E/D FETs 136(1)-136(2) as shown in FIG. 18(*b*) or both E/D FETs 136(1)-136(2) as shown in FIG. 18(*c*).

Figure 20:
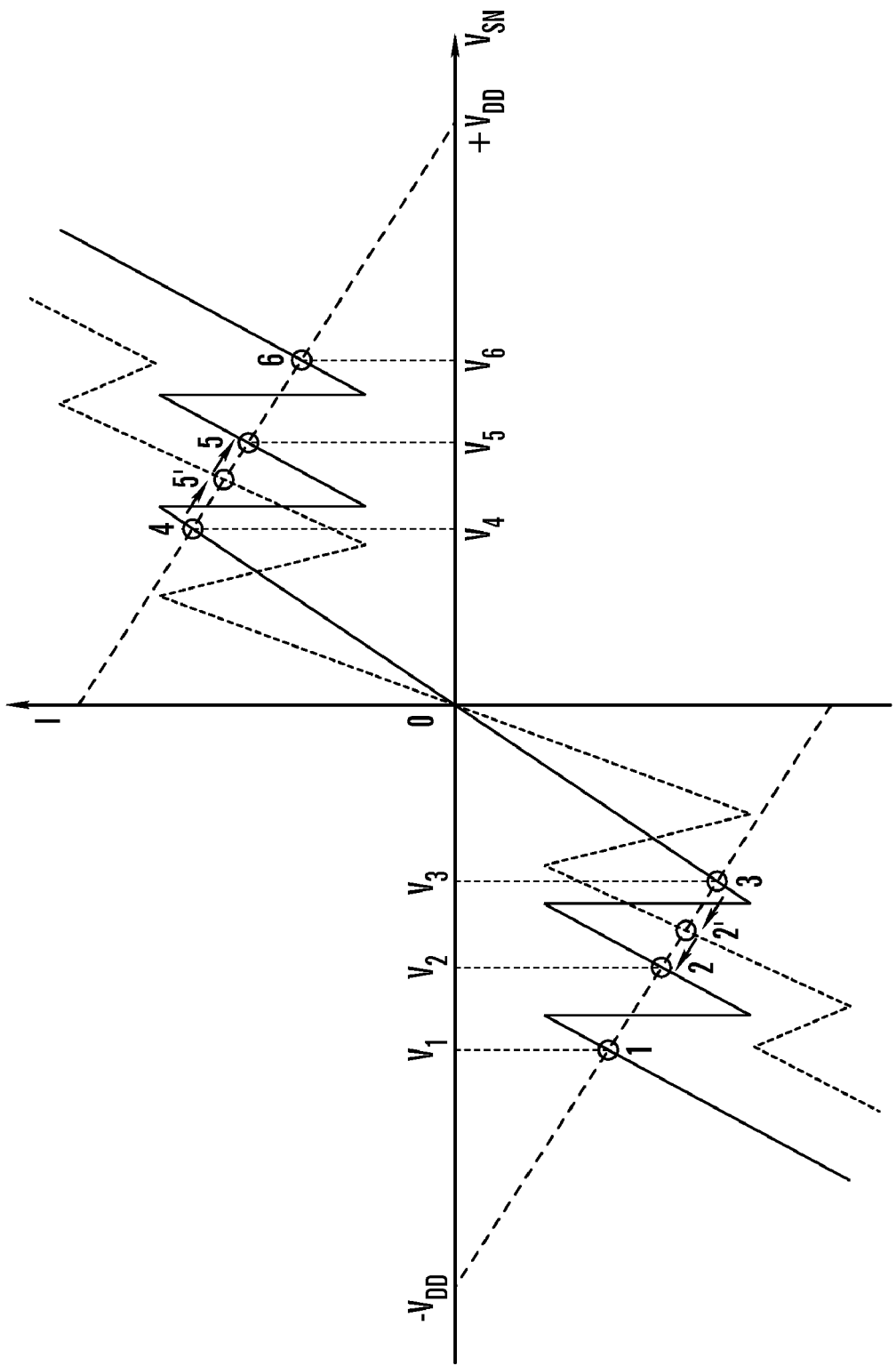
FIG. 20 is a graph of the current-voltage load line analysis of the ambipolar memory cell with the resistive load and the E/D FET shown in FIG. 19.
Figure 21:
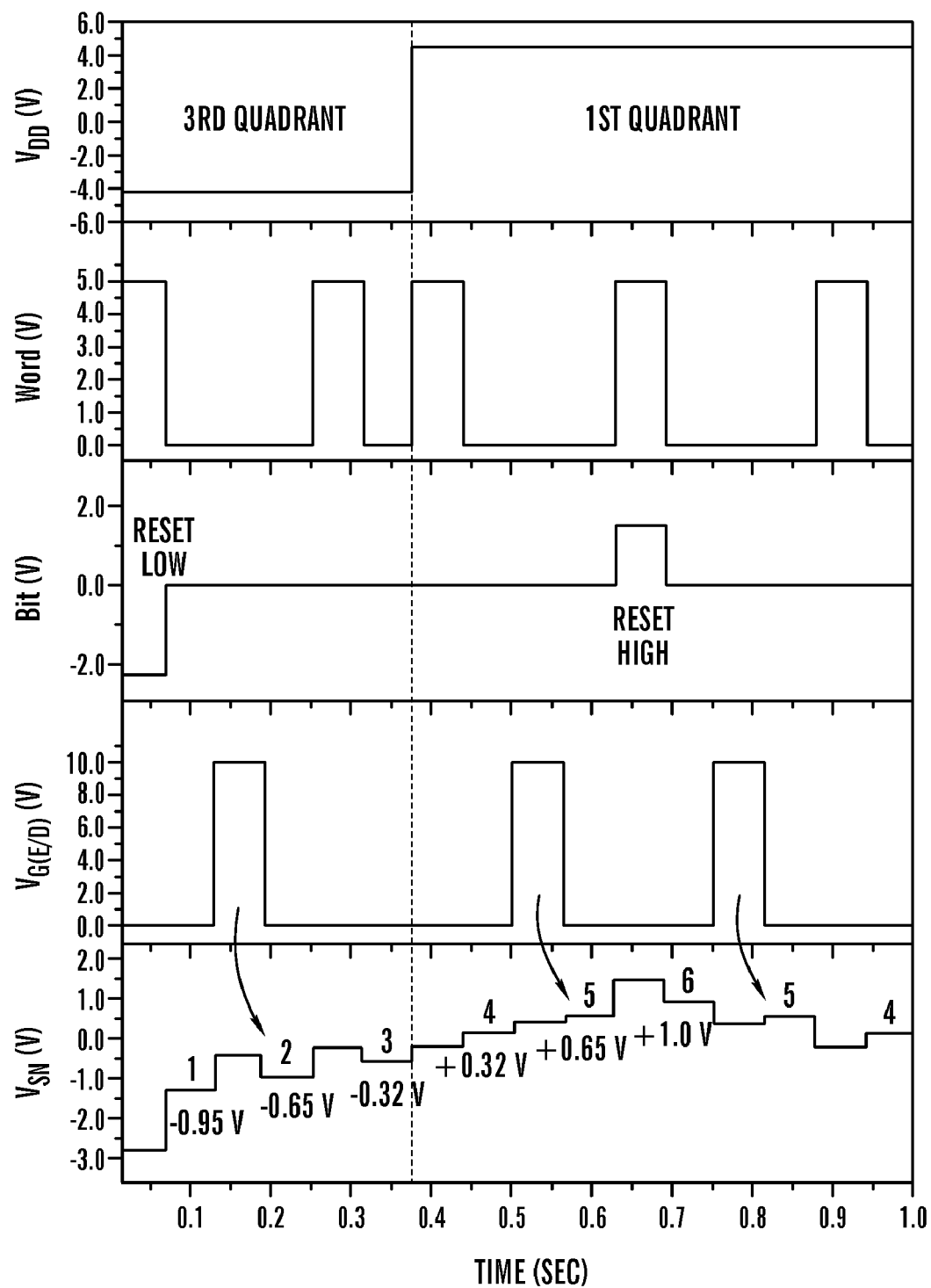
FIG. 21 is a timing diagram of biasing conditions during writing high, write low, and standby operation of the ambipolar memory cell with the resistive load and the E/D FET shown in FIG. 19.

The operation of memory cell 100(7) will now be described with reference to FIGS. 19-21. The memory cell 100(7) provides six logic states by using the combined approach of ambipolar operation and E/D FET. In this particular example, the two standby power supply voltages are −4.35 V and +4.35 V for third and first quadrant operation, respectively. With these standby load lines, there are six possible, substantially stable, logic states. The latching to the highest and lowest logic states are done by performing reset high and low operations, respectively, in accordance with the procedures previously described herein. Moreover, the writing operations to the second and fifth logic states are done by turning on the E/D FET 150 also in accordance with the procedures previously described herein. In order to latch into the third logic state, the gate or Word of FET 148 is opened, and the drain or Bit of FET 148 is grounded while voltage source $V_{DD}$ 144 is still maintained at −4.35 V. Similarly, to latch into the fourth logic state, the gate or Word of FET 148 is turned on while grounding the drain or Bit of FET 148 and switching the voltage source $V_{DD}$ 144 to +4.35 V.

Accordingly, as described herein the present invention provides a memory cell which has a much higher memory density than prior memory cells. Additionally, the present invention substantially alleviates the prior art problem of hysteresis in memory cells by utilizing the ambipolar behavior of multi-peak back-to-back interband tunnel diodes to mirror the latching operation in the first quadrant into the third quadrant. Further, the present invention uses a series of tunnel diodes connected in a way so as to achieve multiple stable logic states via ambipolarity (characteristic operation in the first and third quadrants) or unipolarity (characteristic operation in the first or third quadrant), as well as a series of transistors to facilitate latching between each stable logic state. The present invention also utilizes E/D transistors to assist with this latching to mid-level logic states to help increase memory capacity.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A memory cell comprising:
two or more tunnel diodes coupled together;
a loading system coupled to the tunnel diodes; and
a driving system coupled to the tunnel diodes and the loading system, wherein at least the driving system drives a sense node from the tunnel diodes, the loading system, and the driving system between at least three or more substantially stable logic states and wherein at least a portion of the driving system comprises at least part of the loading system in at least one quadrant and at least another portion of the driving system comprises at least part of the loading system in at least one other quadrant.

2. A memory cell comprising:
two or more tunnel diodes coupled together;
a loading system coupled to the tunnel diodes; and
a driving system coupled to the tunnel diodes and the loading system, wherein at least the driving system drives a sense node from the tunnel diodes, the loading system, and the driving system between at least three or more substantially stable logic states;
wherein an anode of one of the two or more tunnel diodes is coupled to an anode of another one of the two or more tunnel diodes;
wherein the loading system comprises one or more resistors coupled in series with the two or more tunnel diodes; and
wherein the driving system comprises at least one voltage source that provides four or more voltages that drive the sense node between at least four or more of the substantially stable logic states based on the four or more voltages.

3. A memory cell comprising:
two or more tunnel diodes coupled together;
a loading system coupled to the tunnel diodes; and
a driving system coupled to the tunnel diodes and the loading system, wherein at least the driving system drives a sense node from the tunnel diodes, the loading system, and the driving system between at least three or more substantially stable logic states;
wherein a cathode of one of the two or more tunnel diodes is coupled to a cathode of another one of the two or more tunnel diodes; and
wherein the loading system and the driving system comprise at least one p type field effect transistor and at least one n type field effect transistor, a source of each of the p type field effect transistor and the n type field effect transistor are coupled to the two or more tunnel diodes, the p type field effect transistor and the n type field effect transistor drive the sense node between at least four or more of the substantially stable logic states at least based on one or more inputs to a gate and a drain of the p type field effect transistor and the n type field effect transistor.

4. A memory cell comprising:
two or more tunnel diodes coupled together;
a loading system coupled to the tunnel diodes; and
a driving system coupled to the tunnel diodes and the loading system, wherein at least the driving system drives a sense node from the tunnel diodes, the loading system, and the driving system between at least three or more substantially stable logic states;
wherein the loading system comprises one or more resistors coupled in series with the two or more tunnel diodes; and
wherein the driving system comprises two or more field effect transistors that drive the sense node between the three or more of the substantially stable logic states at least based on one or more inputs to a gate and a drain of the two or more field effect transistors.

5. The memory cell as set forth in claim 4 wherein at least one of the field effect transistors is coupled in parallel with at least one of the two or more tunnel diodes.

6. The memory cell as set forth in claim 5 wherein a cathode of at least one of the tunnel diodes is coupled to an anode of another one of the tunnel diodes.

7. The memory cell as set forth in claim 6 wherein the two or more tunnel diodes comprise three or more of the tunnel diodes coupled together;
wherein the two or more field effect transistors comprise three or more of the field effect transistors;
wherein at least two of the three or more of the field effect transistors are each coupled in parallel with one or more of the tunnel diodes; and
wherein the driving system comprises the three or more of the field effect transistors that drive the sense node between four or more of the substantially stable logic states at least based on one or more inputs to a gate and a drain of the three or more field effect transistors.

8. The memory cell as set forth in claim 5 wherein the two or more tunnel diodes comprise two or more sets of tunnel diodes coupled in series, each of the sets of tunnel diodes has a cathode of one of the tunnel diodes in the set coupled to a cathode of another one of the tunnel diodes in the set;
wherein the at least one of the field effect transistors is coupled in parallel with one of the sets of tunnel diodes; and
wherein the driving system comprises the two or more field effect transistors and at least one voltage source that provides two or more voltages that drive the sense node between six or more of the substantially stable logic states at least based on one or more inputs to a gate and a drain of the two or more field effect transistors and on the two or more voltages.

9. A memory cell comprising:
two or more tunnel diodes coupled together;
a loading system coupled to the tunnel diodes; and
a driving system coupled to the tunnel diodes and the loading system, wherein at least the driving system drives a sense node from the tunnel diodes, the loading system, and the driving system between at least three or more substantially stable logic states;
wherein the loading system comprises at least one load field effect transistor;
wherein the driving system comprises at least one drive field effect transistor coupled in parallel with at least one of the two or more tunnel diodes, the drive field effect transistor drives the sense node between the three or more of the substantially stable logic states at least based on one or more inputs to a gate and a drain of the drive field effect transistor.

10. The memory cell as set forth in claim 9 wherein the two or more tunnel diodes comprise two or more sets of tunnel diodes coupled in series, each of the sets of tunnel diodes has a cathode of one of the tunnel diodes in the set coupled to a cathode of another one of the tunnel diodes in the set; and
wherein the drive field effect transistor is coupled in parallel with one of the sets of tunnel diodes.

11. A method for making a memory cell, the method comprising:
coupling two or more tunnel diodes together;
coupling a loading system to the tunnel diodes; and
coupling a driving system to the loading system and the tunnel diodes, wherein at least the driving system drives a sense node from the tunnel diodes, the loading system, and the driving system between at least three or more substantially stable logic states, and wherein at least a portion of the driving system comprises at least part of the loading system in at least one quadrant and at least another portion of the driving system comprises at least part of the loading system in at least one other quadrant.

12. A method for making a memory cell, the method comprising:
coupling two or more tunnel diodes together;
coupling a loading system to the tunnel diodes; and
coupling a driving system to the loading system and the tunnel diodes, wherein at least the driving system drives a sense node from the tunnel diodes, the loading system, and the driving system between at least three or more substantially stable logic states;
wherein the coupling two or more tunnel diodes together further comprises coupling an anode of one of the two or more tunnel diodes to an anode of another one of the two or more tunnel diodes;
wherein the loading system comprises one or more resistors and the coupling the loading system to the tunnel diodes further comprises coupling the one or more resistors in series with the two or more tunnel diodes; and
wherein the driving system comprises at least one voltage source and the coupling a driving system to the loading system and the tunnel diodes comprises coupling the voltage source to the one or more resistors and the tunnel diodes, the at least one voltage source provides four or more voltages that drive the sense node between at least four or more of the substantially stable logic states based on the four or more voltages.

13. A method for making a memory cell, the method comprising:
coupling two or more tunnel diodes together;
coupling a loading system to the tunnel diodes; and
coupling a driving system to the loading system and the tunnel diodes, wherein at least the driving system drives a sense node from the tunnel diodes, the loading system, and the driving system between at least three or more substantially stable logic states;
wherein the coupling two or more tunnel diodes together further comprises coupling a cathode of one of the two or more tunnel diodes to a cathode of another one of the two or more tunnel diodes;
wherein the loading system and the driving system comprise at least one p type field effect transistor and at least one n type field effect transistor; and
wherein the coupling the loading system to the tunnel diodes and the coupling the driving system to the loading system and the tunnel diodes further comprise coupling a source of each of the p type field effect transistor and the n type field effect transistor to the two or more tunnel diodes, the p type field effect transistor and the n type field effect transistor drive the sense node between at least four or more of the substantially stable logic states at least based on one or more inputs to a gate and a drain of the p type field effect transistor and the n type field effect transistor.

14. A method for making a memory cell, the method comprising:
coupling two or more tunnel diodes together;
coupling a loading system to the tunnel diodes; and
coupling a driving system to the loading system and the tunnel diodes, wherein at least the driving system drives a sense node from the tunnel diodes, the loading system, and the driving system between at least three or more substantially stable logic states;
wherein the loading system comprises one or more resistors and the coupling the loading system to the tunnel diodes further comprises coupling the one or more resistors in series with the two or more tunnel diodes; and
wherein the driving system comprises two or more field effect transistors that drive the sense node between the three or more of the substantially stable logic states at least based on one or more inputs to a gate and a drain of the two or more field effect transistors.

15. The method as set forth in claim 14 further comprising coupling at least one of the field effect transistors in parallel with at least one of the two or more tunnel diodes.

16. The method as set forth in claim 15 wherein the coupling two or more tunnel diodes together further comprises coupling a cathode of at least one of the tunnel diodes to an anode of another one of the tunnel diodes.

17. The method as set forth in claim 16 wherein the coupling two or more tunnel diodes together further comprises coupling three or more of the tunnel diodes together and wherein the two or more field effect transistors comprise three or more of the field effect transistors, the method further comprising coupling at least two of the three or more of the field effect transistors in parallel with one or more of the tunnel diodes; and
wherein the driving system comprises the three or more of the field effect transistors that drive the sense node between four or more of the substantially stable logic states at least based on one or more inputs to a gate and a drain of the three or more field effect transistors.

18. The method as set forth in claim 15 wherein the coupling two or more tunnel diodes together further comprises coupling two or more sets of tunnel diodes in series, each of the sets of tunnel diodes has a cathode of one of the tunnel diodes in the set coupled to a cathode of another one of the tunnel diodes in the set;

wherein the at least one of the field effect transistors is coupled in parallel with one of the sets of tunnel diodes; and wherein the driving system comprises the two or more field effect transistors and at least one voltage source that provides two or more voltages that drive the sense node between six or more of the substantially stable logic states at least based on one or more inputs to a gate and a drain of the two or more field effect transistors and on the two or more voltages.

19. A method for making a memory cell, the method comprising:

coupling two or more tunnel diodes together;

coupling a loading system to the tunnel diodes; and coupling a driving system to the loading system and the tunnel diodes, wherein at least the driving system drives a sense node from the tunnel diodes, the loading system, and the driving system between at least three or more substantially stable logic states;

wherein the loading system comprises at least one load field effect transistor; and wherein the driving system comprises at least one drive field effect transistor and the coupling a driving system to the loading system and the tunnel diodes further comprises coupling at least one drive field effect transistor in parallel with at least one of the two or more tunnel diodes, the drive field effect transistor drives the sense node between the three or more of the substantially stable logic states at least based on one or more inputs to a gate and a drain of the drive field effect transistor.

20. The method as set forth in claim 19 wherein the coupling two or more tunnel diodes together further comprises coupling two or more sets of tunnel diodes in series, each of the sets of tunnel diodes has a cathode of one of the tunnel diodes in the set coupled to a cathode of another one of the tunnel diodes in the set; and wherein the drive field effect transistor is coupled in parallel with one of the sets of tunnel diodes.

* * * * *

UNITED STATES PATENT AND TRADEMARK OFFICE
CERTIFICATE OF CORRECTION

| | |
|---|---|
| PATENT NO. | : 7,548,455 B2 |
| APPLICATION NO. | : 11/745328 |
| DATED | : June 16, 2009 |
| INVENTOR(S) | : Reinaldo Vega and Stephen Sudirgo |

Page 1 of 1

It is certified that error appears in the above-identified patent and that said Letters Patent is hereby corrected as shown below:

Col. 1 at lines 7-9, delete "This invention was made with Government support under Grant No. ECS-01460, awarded by National Science Foundation. The U.S. Government may have certain rights." and insert --This invention was made with Government support under Grant No. ECS-01460, awarded by National Science Foundation. The government has certain rights in the invention-- in its place.

Signed and Sealed this

Twenty-second Day of December, 2009

David J. Kappos
*Director of the United States Patent and Trademark Office*